United States Patent [19]

Herbots et al.

[11] Patent Number: 4,800,100
[45] Date of Patent: Jan. 24, 1989

[54] COMBINED ION AND MOLECULAR BEAM APPARATUS AND METHOD FOR DEPOSITING MATERIALS

[75] Inventors: Nicole Herbots; Olof C. Hellman, both of Arlington, Mass.

[73] Assignee: Massachusetts Institute of Technology, Cambridge, Mass.

[21] Appl. No.: 113,740

[22] Filed: Oct. 27, 1987

[51] Int. Cl.$^4$ .............................................. B05D 3/06
[52] U.S. Cl. ................................... 427/38; 118/50.1;
118/58; 118/623; 118/715; 427/255.2;
427/255.3; 427/255.7; 427/294; 427/295;
437/250
[58] Field of Search ..................... 427/38, 255.2, 255.3,
427/255.7, 294, 295; 118/715, 58, 50, 623, 50.1;
437/250

[56] References Cited

PUBLICATIONS

"Molecular Beam Epitaxy of Layered Dy-BA-CU-O Compounds" Schlom et al. (Unpublished).
"Epitaxial Growth and Heterostructure Synthesis by Ion Beam Deposition (IBD)", Herbots et al., pp. 335–349, Proceedings of the Northeast Regional Meeting of the Metallurigical Society, Murray Hill, NJ–May 1–2, 1986.
"Ion Beams with Applications to Ion Implantation", Ch. 5, pp. R. G. Wilson et al., Robert E. Krieger Publishing, Huntington, NY (1979).
"Low-Energy Ion Beam Oxidation of Silicon", S. S. Todorov et al., *IEEE Electr. Dev. Lett.*, vol. EDL-7, 8 468 (1986).
"Ion Beam Deposition of Materials at 40–200 eV: Effect of Ion Energy and Substrate Temperature on Interface, Thin Film and Damage Formation", N. Herbots et al., Mat. Res. Soc. Symp. Proc., vol. 51, 1985 Materials Research Society.
"Ion Beam Deposition", Appleton et al., MRS Bulletin (1987).
J. H. Freeman et al., "The Epitaxial Synthesis of Diamond Deposition of Low Energy Carbon Ions", *Vacuum*, vol. 34, Nos. 1-2 (1984).
"Semiconductor-Based Heterostructure Formation Using Low Energy Ion Beams": Ion Beam Deposition (IBD) & Combined Ion and Molecular Beam Deposition (CIMD), N. Herbots et al. (Unpublished).
"Ion-Solid Interactions During Ion Beam Deposition of Ge and Si on Si at Very Low Ion Energies (0–200 eV Range)", Herbots et al., *Nuclear Instruments and Methods in Physics Research* B13 (1986), 250–258, No. Holland, Amsterdam.
"Low Temperature Epitaxial Growth of Si and Ge and Fabrication of Isotopic Heterostructures by Direct Ion Beam Deposition", Appleton et al., *Nuclear Instruments and Methods in Physics Research* B19/20 (1987, 975–982, No. Holland, Amsterdam.
"Direct Formation of Thin Films and Epitaxial Overlayers at Low Temperatures Using a Low-Energy (10–500 ev) Ion Beam Deposition System", Zuhr et al., MRS Proceedings, Spring MRS 87, Anaheim, CA.

*Primary Examiner*—Bernard D. Pianalto
*Attorney, Agent, or Firm*—Hamilton, Brook, Smith & Reynolds

[57] ABSTRACT

A method and apparatus is described for combined deposition of thin films of materials from an ion beam source and a molecular beam source in a single reactor.

49 Claims, 12 Drawing Sheets

⊙→ E  *incoming ion*

⊚     *target atom*

⊙→ E  *incoming ion*

⊚     *target atom*

RESULT   ⊶  defect pair

○     interstitial

○     vacancy

⊙→ E  *incoming ion*

⊚     *target atom*

RESULT   ⊚↗  sputtered atom
          S

⊶ ⊷   2 defect pairs
○     interstitial
○     vacancy

RESULT
- sputtered atom
- 4 defect pairs
- interstitial
- vacancy
- relocation

RESULTS: ion anchored on a lattice site no residual damage

TEMPERATURE (400-700 K)

RESULT
- sputtered atom
- interstitial
- vacancy
- thermal annihilation

COMBINED ION AND MOLECULAR BEAM APPARATUS AND METHOD FOR DEPOSITING MATERIALS

DESCRIPTION

TECHNICAL FIELD

This invention relates to the deposition, growth, and deposition and processing of materials on substrates.

BACKGROUND OF THE INVENTION

In recent years, a number of techniques for depositing, growing, and processing thin films of various materials with optimum control of purity, composition and microstructure have become of extreme interest and the subject of intensive research by workers in the field. Such techniques include thermal evaporation, DC sputtering, RF sputtering, ion beam deposition (IBD), ion cluster beam deposition (ICBD), chemical vapor deposition (CVD) (and related techniques, such as PECVD, MOCVD, etc.), electro-plating, molecular beam epitaxy (MBE), liquid phase epitaxy (LPE) deposition and laser assisted and/or enhanced deposition. The latter may include laser thermochemical deposition and laser photochemical deposition. Each of the techniques for forming thin films carry with them certain advantages and disadvantages.

The structure of thin films can be amorphous, polycrystalline, epitaxial or polycrystalline with a preferred orientation. In amorphous films, the atoms are not arranged in any crystalline order. In polycrystalline films, there are many small regions, called grains, in which the atoms are arranged in a regular crystalline order, but the grains have a random crystallographic orientation with respect to each other. A single crystal film is a special form of thin film growth, in which all atoms of the film belong to one single large grain. In other words, the atoms are crystallographically ordered within one single lattice structure. The term "epitaxial", as applied to polycrystalline or single crystal films, indicates that the lattice orientation of the film is aligned with the underlying crystalline substrate in such a way that it forms a commensurate, discommensurate, or uncommensurate interface. A polycrystalline film with preferred orientation, is composed of many small grains, in each of which the atoms are arranged in a regular crystalline order, and one or more of the crystalline axes of the majority of said regions are close to being parallel.

A thin film can be the same material (that is, the same element or compound) as the substrate, or it can differ in chemical composition from the substrate. If the film is epitaxial, the former is called "homoepitaxy" and the latter "heteroepitaxy".

The present invention pertains to both MBE and IBD, therefore, the pros and cons of each are discussed below.

MBE is basically an ultra-high vacuum evaporation technique in which effusion cells, sometimes referred to as Knudsen cells, containing sources of the material to be deposited are introduced into an ultra-high vacuum chamber, along with a substrate. The sources are heated until vaporized. Because of the high vacuum, the source atoms or molecules in the vapor move with few gas phase collisions and deposit on any surface they reach. When they land on a hot substrate surface, they are physisorbed and sometimes chemisorbed, forming a high quality (i.e., low defect density) epitaxial film. Low defect density means that the number of defects, such as, dislocations, twin boundaries, stacking faults, or other crystalline imperfections is relatively low per unit volume.

There are two main advantages to using MBE for growth of thin films.

First, the ultra-high vacuum provides a clean environment for deposition, and second, a number of source cells can be provided in the chamber with different source materials. By using a mechanical shutter between each source and the substrate, successive or simultaneous beams of molecules or atoms from successive sources can be directed at the substrate and very abrupt transitions can be obtained between multi-layered films of different compositions (heterostructures) and/or doping levels.

The main disadvantages associated with the MBE system are the high cost of the reactor coupled with the dedicated nature of each system. Because the source elements are deposited in a gas phase, the entire chamber becomes contaminated with source material. Hence, each chamber can only be used for a limited number of reactions compatible with the contaminating material. For example, if an arsenic effusion cell is introduced in a Si MBE chamber, the whole reactor will be contaminated with arsenic, once this cell has been used, to the extent that the chamber would be rendered useless for growth of materials whose properties are altered by very small amounts of arsenic. An example of such a material is $NiSi_2$, grown to form a low-resistivity ohmic contact with As-doped Si. Arsenic contamination degrades the properties of the contact. Another example is boron doped Si. The p-type boron doped Si material cannot be grown in an arsenic contaminated environment, because the arsenic converts the Si material to n-type. Decontamination of a reactor is extremely impractical, as it requires a complete dismantling and cleaning of the system.

As a consequence of this problem for MBE facilities, each material that may cross-contaminate with another material used in that heterostructure has to be grown in a separate chamber in order to grow heterostructure semiconductors. This leads to systems with multiple chambers, i.e., up to 8, with each chamber valued between $600,000 and $1,000,000.

Another disadvantage of MBE is the inherent limitation of the choice of dopant. If the melting or sublimation temperature of a dopant is too high, then the confinement of a solid source in a Knudsen cell is impractical, because of the high temperatures required. For example, Boron, whose melting point is very high (2300° K.), cannot be used as a dopant in present MBE technology. Alternate p-type dopants (Al,Ga) must be used despite their inferior diffusion and segregation properties, as compared to Boron.

Another disadvantage of MBE is the difficulty of accurately controlling dopant profiles. This difficulty is due both to the angular variation of evaporant flux and to the dependence of sticking coefficient on temperature.

In addition, the MBE process requires heating the sorce material at temperatures above the melting point of that material, in order to form a vapor. When refractory materials are used, such as silicon or transition metals, such high temperatures pose problems. For example, molten silicon is a universal solvent. At present no reliable material has been found that can contain molten silicon in order to form an MBE source of silicon of the Knudsen cell type.

Electron beam evaporators therefore have to be used instead of an effusion cell. However, this is a difficult and expensive technology, adding to the cost of the several reactors necessary to eliminate cross-contamination. Also, during deposition conducted at such high temperatures, the substrate and the deposition materials can decompose after deposition during the growth of the subsequent film. This makes it impossible, for instance, to grow epitaxial silicon or gallium arsenide with adequate interface quality. It is also impossible to form a silicon based modulation doped superlattice with an atomically sharp doping profile using MBE. This is because undesired diffusion of dopants from one layer to another occurs during subsequent growth of epitaxial silicon. For example, Al and Ga, the most commonly used p-type dopants used in silicon MBE, are too mobile to maintain sharp dopant profiles, even at the lowest possible temperature for silicon MBE.

Furthermore, when depositing refractory materials in addition to the necessity of using sophisticated electron beam evaporation guns to vaporize the materials, the heat released by the process is two to three times larger than when effusion cells are used. This leads to increased difficulties on all aspects of cooling, shielding, cryoshielding and vacuum technology.

Lastly, the deposition rate of MBE processes is slow (about 1 micron/hour) causing low throughput and the necessity of expensive vacuum technology to reduce gas adsorption during growth to less than a few parts per billion.

IBD

Research and development of MBE systems for the growth of epitaxial thin film heterostructures has been conducted for over 35 years. The potential use of ion beam deposition (IBD) for such applications began in the early 1970's [J. H. Freeman, W. Temple, G. A. Gard, "The Epitaxial Synthesis of Diamond Deposition of Low Energy Carbon Ions", *Vacuum*, Vol. 34, Nos. 1-2 (1984);J. Freeman, "Proceedings of the International Conference of Applications of Ion Beams to Semiconductor Technology, Grenoble (1976)] and continues to this day. IBD is a materials growth technique by which thin films are deposited directly from ions. The energy of the ions is selected to be low enough to allow growth of an overlayer from the build-up of incoming ions. This condition requires that 50% of the total energy distribution for a given ion is below the self-sputtering threshold. The self-sputtering threshold is defined as the lowest energy at which the self-sputtering yield reaches one atom per ion. This threshold can be affected by substrate temperature [N. Herbots, B. R. Appleton, T. S. Noggle, R. A. Zuhr and S. J. Pennycook, *Nucl. Instr. Methods*, B13, 250 (1986); N. Herbots, B. R. Appleton, S. J. Pennycook, T. S. Noggle, and R. A. Zuhr, 369, *Beam-Solid Interactions and Phase Transformations*, ed. by H. Kurz, G. L. Olson, and J. M. Poate, Mat. Res. Soc. Symp. Proc, Vol. 51, 369, (1986); and N. Herbots, B. R. Appleton, T. S. Noggle, S. J. Pennycook, R. A. Zuhr, and D. M. Zehner, *Semiconductor-based Heterostructures: Interfacial Structure and Stability*, ed. by M. L. Green, J. E. E. Baglin, G. Y. Chin, H. W. Deckman, W. Mayo and D. Narasinham, The Metallurgical Society, Inc. (1986)].

Efficient ion production and transport at rates sufficient to provide a reasonable growth rate can be realized by using a system similar to an ion implantation accelerator (also called ion implantor). Such a system comprises an ion source, an extraction magnet, an acceleration tube and an analysis magnet, as described in the following reference [Robert G. Wilson and George P. Brewer, *Ion Beams with Applications to Ion Implantation*, Ch. 5, p. 399, Robert E. Krieger Publishing, Huntington, N.Y. (1979)].

IBD has a distinct advantage over MBE; in that IBD allows high vapor pressure materials to be introduced into the deposition chamber by using an ionization chamber, called an ion source, for such materials, and extracting ionized material through electrostatic and electromagnetic fields. The extracted ionized materials are electrostatically accelerated and electromagnetically focused into a directional ion beam. Because the spreading of the ion beam is controlled through electrostatic and electromagnetic focusing, ions can be introduced into the chamber but can be limited to the deposition area, i.e., the substrate surface only, thus avoiding contamination of the chamber, per se. A single reactor can thus be used for incompatible materials which would otherwise strongly cross-contaminate, such as arsenic and gallium in a silicon chamber, or oxygen and silicon.

The main disadvantage of IBD is that while an ion source can be used for any given material, only one source at a time can presently be used. So that, to form compound films, more than one expensive ($150,000) ion source, including ion extraction, acceleration and magnetic analysis apparatus, are needed, making the cost of IBD prohibitive. Additionally, it is technically difficult to provide more than one ion beam in a UHV chamber.

SUMMARY OF THE INVENTION

The method and apparatus of the invention comprise the combination of MBE and IBD, in a unique and novel way, to create a new materials processing system, i.e., Combined Ion and Molecular Beam Deposition (CIMD). CIMD allows the growth of novel artificially structured materials and the study of thin films in processing conditions that neither MBE nor IBD, used independently, presently permit. The general concept of CIMD is to simultaneously use a neutral molecular beam and a focused low energy ion beam to form layered films, such as epitaxial heterostructures. Simultaneous use of both types of beams allows the fabrication of structures and epitaxial and/or compound films at lower temperatures, or higher rates, than obtainable when MBE is used alone. The CIMD technique thus combines the main attraction of IBD, i.e., the enhancement of kinetic processes in the rate of formation of a thin film phase at a given temperature, while retaining important advantageous features of MBE.

For the growth of elemental films, CIMD provides a unique process for the formation of epitaxial heterostructures at low temperatures. The molecular beam provides a high flux of the desired material, while an ion beam of the same species is used to enhance atomic mobilities at or near the growing interface. This enhancement occurs through exchange of the kinetic energy of the ions with the substrate atoms and the deposited atoms, during collisional processes. The kinetic energy of ions is used to reduce the temperature needed for epitaxial growth, effectively reducing undesirable thermal diffusion, de-adsorption and thermal decomposition effects. These temperature dependent effects constitute a heretofore unresolved problem in the formation of sharp modulation doping profiles on Si and compound semiconductor.

Although IBD used alone can enhance kinetic processes in the same fashion by selection of the ion energy $E_i$, CIMD has the crucial additional degree of freedom to manipulate kinetics. CIMD has the capability of adjusting the ratio R of ion flux $\Phi_i$ to the molecular beam or neutral flux $\Phi_o$ ($R=\Phi_i/\Phi_o$). This allows one to control the flux, or rate per unit of area, of defects $\Phi_d$. The flux of defects $\Phi_d$ is a function of the product of the ion flux $\Phi_i$ and the ion energy $E_i$. Thus, $\Phi_d = A(M_i, Z_i, M_s, Z_s, E ...) \cdot \Phi_i \cdot \Phi E_i$ where A is a complex function of the substrate and the deposited ion mass ($M_s$, $M_i$), the atomic number ($Z_s$, $Z_i$) and electronic and mechanical properties, and where $\Phi_i$ and $E_i$ are two independent variables. This means that $\Phi_d$ can be modified by varying $R=\Phi_i/\Phi_o$ while maintaining $E_i$ constant. In IBD processes, R is a constant greater than 1000 determined by the ion source, the ion beam line characteristics and the probability $P_i$ of ion beam neutralization. In other words, $\Phi_o$ is a direct function of $\Phi_i$, by the expression $\Phi_o$ is proportional to $P_i\phi_i$. Hence, R is proportional to $1/P_i$ and is therefore independent of the ion beam intensity. The probability $P_i$ is the product of $\Phi_i$ and the cross-section $\Omega_{i,g}(P,N_g)$ for neutralization of a given ion "i" with the residual gases "g" in the beam line. The cross-section $\Omega_{i,g}(P,N_g)$ is a linear function of the pressure in the beam line and the chamber and is also a complex function of the composition g of residual gases in the chamber.

Therefore, in CIMD, R can be decreased for a fixed energy $E_i$ and fixed substrate temperature by varying the ion flux $\Phi_i$ (adjustment of the ion beam intensity) or varying the molecular beam intensity $\Phi_o$, thereby creating an epitaxial layer at low temperature that is defect free. The molecular beam intensity may be adjusted by varying filament current in the case of an electron beam source, or by varying the current in the heater coil of Knudsen-type effusion MBE sources. To adjust ion beam intensity, the current in the ion source filament is varied. With IBD alone, this is not possible. Once the energy and the temperature are chosen, R is constant and an unavoidable finite amount of defects remain in the film. These defects are usually large enough to affect the electronic properties of the film.

Thus, CIMD allows epitaxial growth at low temperatures by use of the IBD features, and also allows high epitaxial growth rates by combining it with MBE features. The combination of these two features is especially important for fabrication of heterostructures.

BRIEF DESCRIPTION OF THE DRAWINGS

FIG. 4 is a plan view of a suppressor electrode 450.

DETAILED DESCRIPTION OF THE INVENTION

Figure 1A:
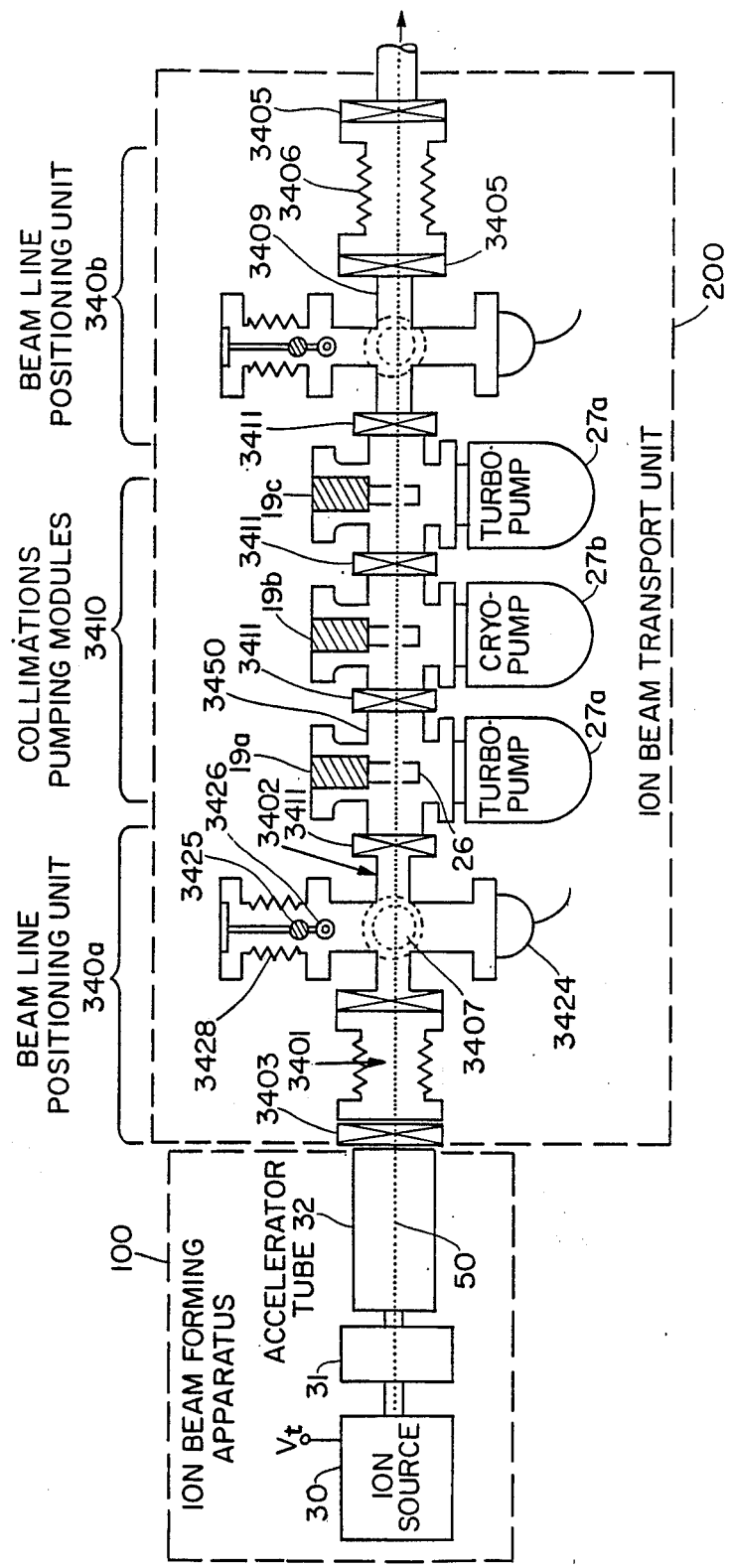
FIG. 1a–1b is a schematicized drawing showing the details of a combined ion and molecular beam deposition system of the invention.
Figure 1B:
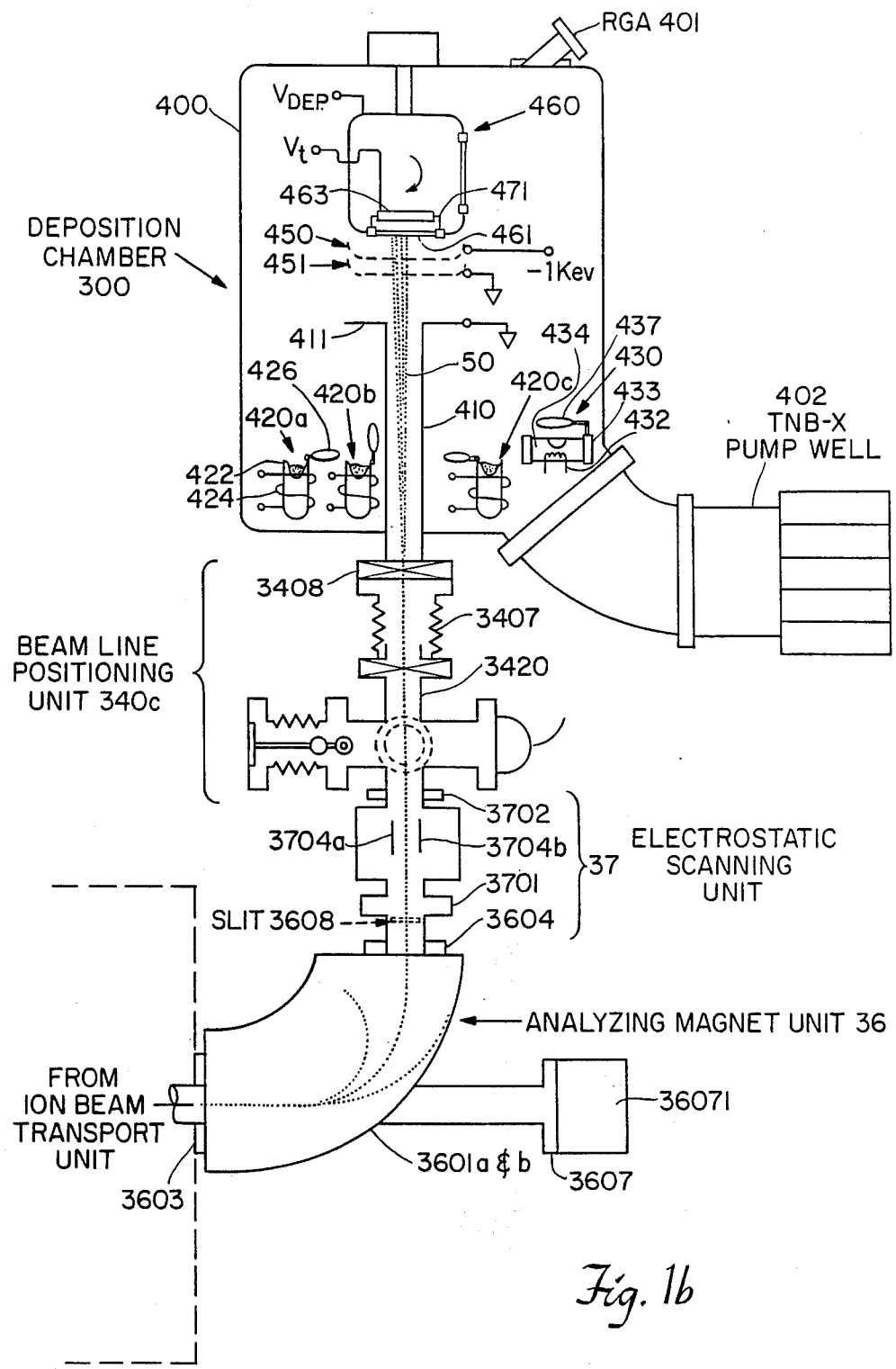

Referring now to FIG. 1a–b, the apparatus of the invention may be seen to comprise, in general, an ion beam forming apparatus 100; an ion beam transport unit 200, an analyzing magnet unit 36, a scanning unit 37, and a multipurpose deposition chamber 300.

Ion Beam Forming Apparatus

The ion beam forming apparatus 100 consists of an ion source 30, an ion extraction unit 31 for extracting ions from the source and an acceleration unit or accelerator tube 32 for accelerating the extracted ions. Note that in some cases the extraction unit 31 forms an integral part of the ion source 30.

Ion Source

Ion source 30 preferably comprises a hot or cold cathode duoplasmatron-type or Freeman-type ion source (including filament sources) for extracting a plasma from gaseous, liquid, or solid sources. Source 30 efficiently produces nearly all elements in ionized form, including refractory materials. The composition of the source materials loaded in ion source 30 as starting materials for ionization are selected to avoid mass conflict with the ions to be successively deposited. For example, to deposit silicon carbide from solid Si or silane gas (SiH$_4$) and carbon oxide gas, $^{28}$Si should not be selected because when ionized once, it has the same charge to mass ratio (Q/M) as CO with a charge +e; wherein e is $1.60206 \times 10^{-19}$ coulombs.

After extraction from ion source 30, the ions preferably have sufficient energy for efficient beam transport, focusing, etc., provided ion source 30 produces an adequate extraction voltage $V_e$. $V_3$ should range from 1 kV to less than 65 kV; depending on the length of the beam line. ($V_e$ should increase with increasing length.) Alternatively, the ions can be further accelerated to the transport voltage $V_t$ just before transport into the ion beam transport unit 200. This is to avoid space charge effects leading to excessive angular divergence. The necessary acceleration can be provided by acceleration tube 32, which is preferably a linear acceleration tube in which the voltage can be adjusted to the desired value, so that $V_t$ can be selected between $V_e$ and 65 kV.

Ion Beam Transport Unit 200

After the ion beam 50 is brought to a selected transport voltage $V_t$, the ions are transported through ion beam transport unit 200 which produces sufficient differential pumping to maintain a pressure of $10^{-10}$ Torr within the deposition chamber 300 during operation, that is, when the ion beam is impinging on the substrate 461. Unit 200 also contains means 340a and 340b for positioning the beam 50 along a central line.

The ion beam transport unit 200 is comprised of two beam line positioning units 340a and 340b, one on each side of a row of three successive collimation/pumping modules 3410, each separated by valves 3411. The first beam line positioning unit 340a is connected by valve 3403 and bellows 3401 to the ion accelerator tube 32. A second beam line positioning unit 340b is connected by valve 3405 and bellows 3406 to the interior chamber of magnet unit 36.

Beam Line Positioning Units 340a-c

Figure 2:
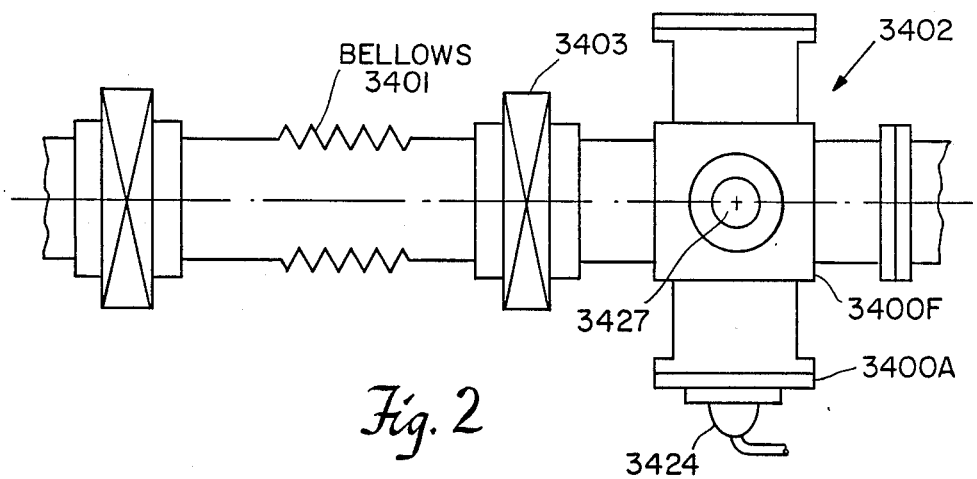
FIG. 2 is a detailed schematic top view of a beam line positioning (BLP) unit 3402 of the invention.
Figure 3:
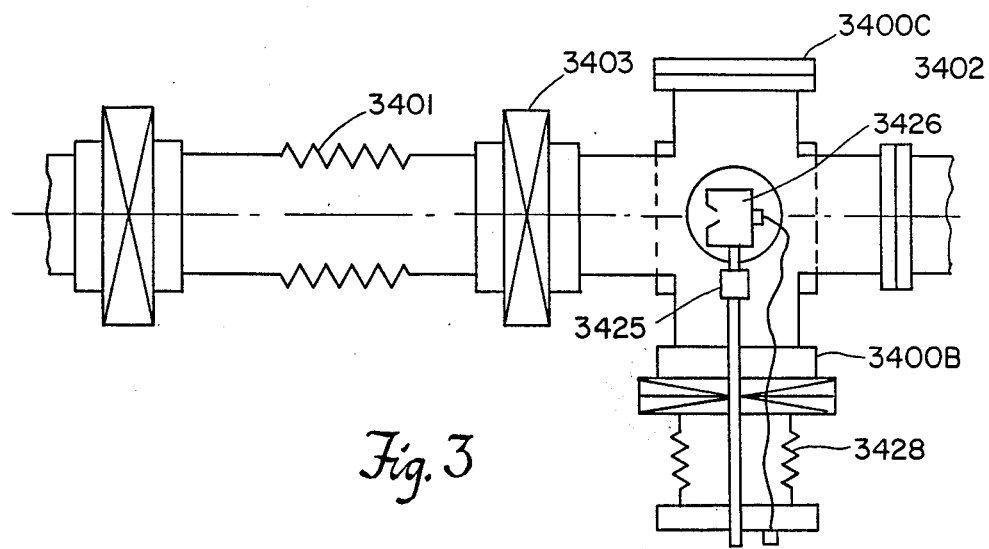
FIG. 3 is a partially sectional side view of the BLP of FIG. 2.

Note that an additional beam line positioning (BLP) unit is located downstream of magnet unit 36, intermediate the scanning unit 37 and the chamber 300. Bellow 3407 and valve 3408 couples the BLP unit 340 to chamber 300. BLP units 340a and 340b permit precise alignment of the ion beam transport unit 200 with respect to the ion beam 50 and monitoring of the position and shape of the ion beam 50. BLP 340c performs a similar function for the beam alignment within the ion beam line 410 and scanning unit 37. Each BLP unit 340a, b, and c comprises bellow 3401, 3406, respectively, and a 6-way cross coupler 3402, 3409, 3420, respectively, separated by a UHV valve 3403, 3405, 3408 (See details of BLP 340a in FIGS. 2 and 3). A side flange 3400A of the 6-way crosscoupler, preferably the flange facing down, supports an ion gauge 3424, which measures vacuum pressure within the line. A second flange 3400B incorporates a quartz scintillator 3425 and Faraday cup 3426 on a rod passing through a second bellows 3428. The quartz scintillator 3425 permits easy detection and beam shape evaluation. The Faraday cup 3426 permits spatial profiling of the beam current density. Positioning of the scintillator or the Faraday cup in the path of the beam 50 is accomplished by mounting the supporting flange 3400E on bellows mechanism 3428, which allows linear travel of the beam probes 3425 and 3426. A third flange 3400F of the cross coupler 3402 supports a viewport 3427 for visual examination of the position of quartz scintillator 3425.

Ion Beam Collimation/Pumping Module 3410

Figure 4:
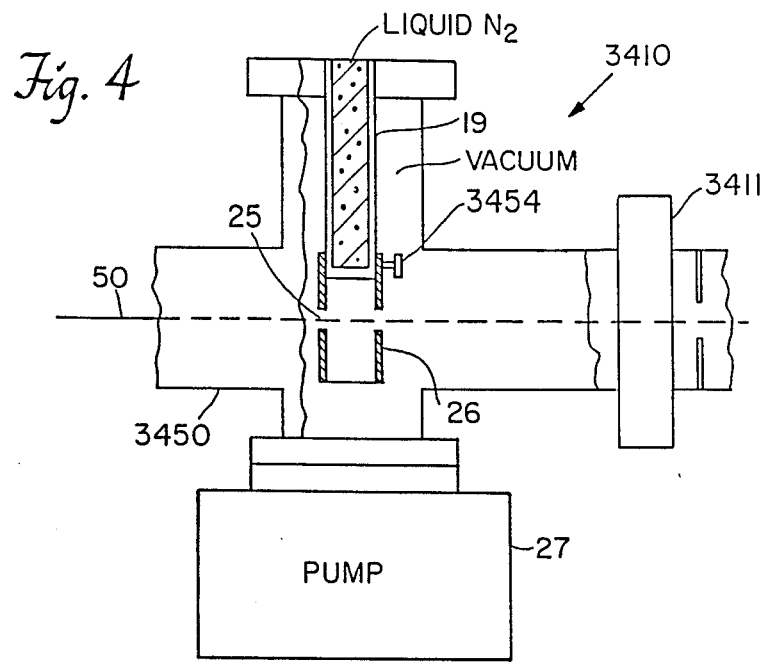
FIG. 4 is a partially sectional top view of an ion beam collimation/pumping module 3410.

The ion beam transport unit 200 also incorporates a succession of liquid nitrogen cooled collimating and pumping modules 3410, in this case three. The individual modules 3410 are alike, except for the pumps 27a or 27b. One such module is shown in detail in FIG. 4. A liquid nitrogen filled shroud 19 is inserted into the beam line 3450. In intimate contact with each shroud 19 is a metallic cylinder 26, with two circular or square apertures 25, aligned along the center line of the ion beam 50. The diameter of the apertures are preferably 15% larger than the diameter of the ion beam 50 for collimating the beam without generating an excess of scattered particles, while still allowing most of the ion beam to pass without excessive angular divergence. A high thermal conductivity material, such as copper, is preferably used for cylinder 26, so that the apertures 25 quickly reach liquid nitrogen temperature when the shroud is filled and warms up reasonable fast when required. The purpose of these apertures, besides beam collimation, is to absorb residual gases transmitted in the line of sight of the ion beam. Because these apertures are smaller than the diameter of the beam line 3450 itself, differential pumping also results. This means that the pressure on the side of the aperture 25 further away from the ion source may be maintained lower than the pressure on the side closer to the ion source. For example, if the pressure on the closer side of an aperture is $10^{-8}$ Torr, the pressure on the side away from the ion source can drop to $3 \times 10^{-9}$ Torr. The apertures are aligned and fixed into position by means of nuts and bolts. Two bolts 3454 (one not shown) going through the metal of the collimator cylinder 26 apply sufficient pressure against the walls of shroud 19 to maintain the cylinder 26 in position when cooling occurs and the materials of 26 and 19 thermally contract in dissimilar fashion. Three such modules, each with two apertures 25, are recommended for maintaining a vacuum of $2 \times 10^{-10}$ Torr in the deposition chamber 300.

Figure 5:
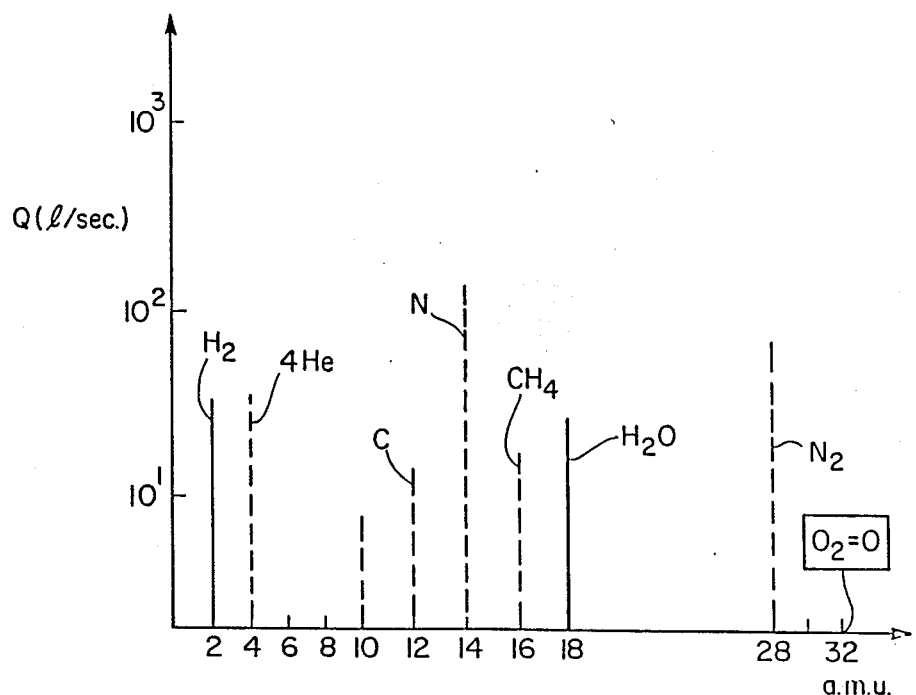
FIG. 5 is a chart plotting the quantity in liters per second versus atomic mass units (a.m.u.) illustrating which molecules are pumped more efficiently by a cryopump (solid line) or by a turbomolecular pump (dashed line).

A pump 27 is provided. The pump may be either a turbomolecular pump 27a, or a cryopump 27b. This pump location provides efficient gas evacuation from the beam line when the liquid nitrogen cooled shrouds 19 are periodically warmed up between CIMD depositions to maintain physisorption efficiency. When this occurs, gases that had been adsorbed on the apertures 24 and on the shrouds 19 are desorbed. Proximate placement of cryopumps and turbomolecular pumps near the liquid nitrogen cooled shrouds 19 is ideal for the evacuation of these desorbed gases from the beam line 3450. The preferred arrangement of pumps near these shrouds is the placement of turbomolecular pumps 27a beneath the first and third shrouds 29a and 19c, and the placement of a cryopump 27b below the second shroud 19b. These pumps are complementary in their efficiency of evacuating different gases. Turbomolecular pumps are most efficient at pumping methane and nitrogen, for instance, while cryopumps are most efficient at pumping hydrogen and water vapor (See the chart of FIG. 5). The complementary placement of two high speed turbomolecular pumps and one high speed cryopump maximizes the efficiency of the ion beam transport unit 200. This arrangement results in a total pumping speed higher than 1200 liters/second.

Analyzing Magnet Unit 36

Figure 6:
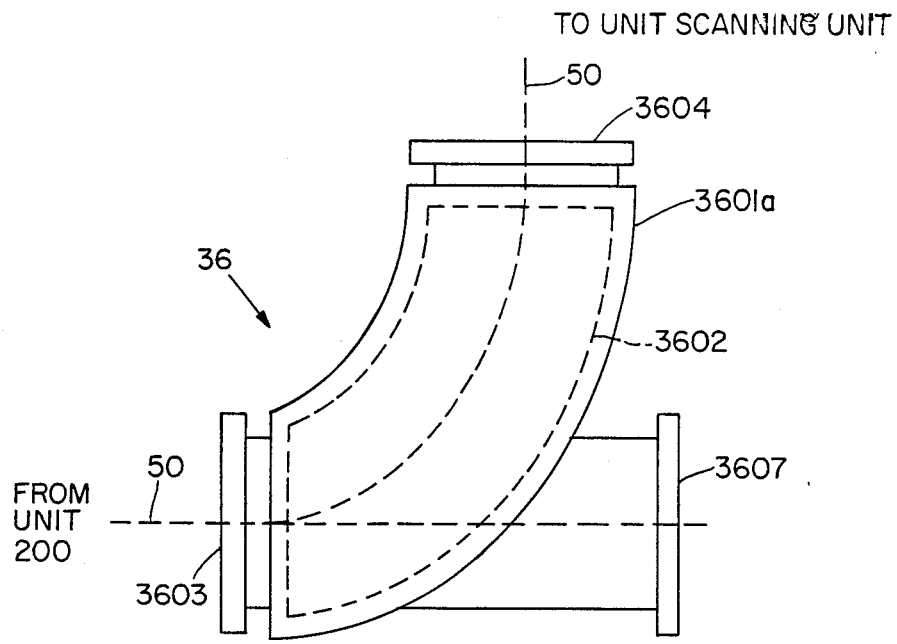
FIG. 6 is a top view of magnet unit 36.
Figure 7:
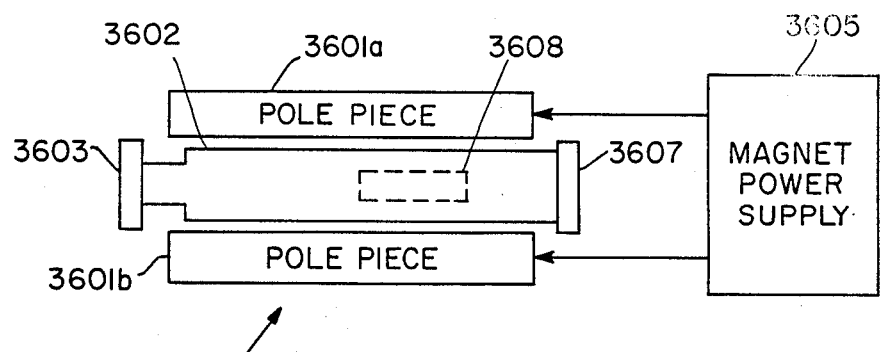
FIG. 7 is a side view of magnet unit 36.

The analyzing magnet unit 36 is shown in FIGS. 6 and 7. Unit 36 comprises an electromagnet 3600 composed of two pole pieces 3601a and 3601b and a magnet chamber 3602, shaped and located to fit between the pole pieces of the magnet with the beam 50 being transported at the center line of the magnetic field within the chamber. Two connection flanges 3603 and 3604 connect the magnet chamber 3602 to the end of the ion beam transport unit 200 on one side and the electrostatic scanning unit 37 on the other side. A power supply (not shown) provides the large current needed to produce the magnetic field in the pole pieces of the magnet. An additional flange 3607 is provided in direct line of sight of flange 3603 to allow for a second unit 36 is another CIMD deposition chamber were to be added. Alternatively, as shown in FIG. 1b, a samll impact chamber 36071 may be coupled to flange 3607. Chamber 36071 could be used to absorb undeflected high energy materials with an ion pump coupled to a titanium sublimation pump (not shown) within the chamber. Maximal absorption of impinging particles is thereby provided.

The analyzing magnet serves the primary function of selectively choosing ions from ion beam 50 of similar ion masses to produce a high-purity beam that can sometimes be monoisotopic. The magnet also has the important function of bending the beam so that it impinges on the target substrate 461 at the desired angle. This angle is preferably normal to the surface to minimize ion losses by sputtering and backscattering, but it can be as high as 60 degrees from surface normal to accommodate special geometry requirements.

The magnetic chamber is also provided with cryogenic shrouds (not shown) to maximize absorption of ions rejected by mass/energy analysis and to minimize ion induced gas emission.

Principles of Mass Analysis

Analyzer magnet 36 analyzes ion beam 50, so that only ions having the correct charge to mass ratio (Q/M) for a fixed energy $Q \times V_t$ are allowed to exit the chamber. The analyzer magnet 36 must be capable of rejecting contaminants of similar charge Q and comparable mass M. The magnetic filtering occurs through selection of ions by the Q/M ratio. The magnet 36 bends ions from the parallel, proximate trajectories they follow when entering between the pole pieces 3601a,b of the magnet into spatially well-separated trajectories as a function of the Q/M of the ions. This means that only ions of equal Q/M ratio will keep following close, parallel trajectories through the magnet. These ions exit the magnet at nearly the same location. A slit 3608 is positioned between the exit of the chamber 3604 and the entrance to the scanning unit 37. The slit only allows ions of the wanted Q/M ratio to enter the scanning unit 37 and pass to deposition chamber 300. By simply changing the current through the magnet, using power supply 3605, the magnetic field of the magnet can be adjusted to select ions of a different Q/M ratio to pass through the filtering slit.

The resolution of the magnet is equal to the minimal differential deflection between the trajectories of two ions of different masses necessary to select one ion from the other through the filtering slit. The mass resolution R of the magnet is expressed in relative units of mass M divided by mass increment dM, hence R=M/dM. The deflection of the ion beam provided by the magnet and the resolution of the magnet in mass analysis are two interdependent parameters of magnet design. Greater beam deflection requires a stronger magnetic field for a given ion energy. A stronger magnetic field implies a greater differential deflection for ions as a function of their masses, which in turn implies a smaller mass increment dM over the width of the filtering slit. Thus, the resolution R of the analysis magnet 36 may be increased for constant mass M by increasing the deflection of the ion beam. In practice, a twenty degree bend magnet translates into a resolution R of approximately 75, and one of 90 degree bend into a resolution R of approximately 1200 for typical values of magnetic fields and magnet dimensions.

Filtering occurs by adjusting the magnetic field and proper consideration of the Q/M ratio. For example, for separating a silicon isotope of mass 30 and charge +e, the magnetic field is set to select particles having a Q/M ratio of 30, through the filtering slit 3608, which allows the separation of $^{30}Si$, which has a mass of 30 atomic mass units (a.m.u.), for example, from carbon oxide (CO) which has a mass of 12+16=28 a.m.u., i.e., a mass 12 for the carbon and 16 for the oxygen for a total mass of 28. If the CO molecule has a +e charge, then its Q/M ratio is e over 28 a.m.u. In contrast, the Q/M ratio of $^{30}Si$, charge +e is e/30 a.m.u. Note that the most abundant isotope of silicon is $^{28}Si$, but use of $^{28}Si$ would cause contamination of the beam by CO. Therefore, by using $^{30}Si$, one can avoid contamination with CO.

The resolution of the magnet must be sufficient to separate gallium and arsenic, for instance. Gallium has a most abundant isotope $^{69}Ga$ which has a mass of 69 a.m.u. The most abundant isotope of arsenic is $^{75}As$ with a mass of 75 a.m.u. To separate these two isotopes, a mass resolution of M/dM=75/6=12.5 is needed. To cover all elements, up to uranium (mass=258 a.m.u.) with a mass separation of 1 a.m.u., the minimal resolution R of the analysis magnet 36 should be greater than 258.

The other consideration in selecting the proper magnetic system, is access to the chamber, and the direction of the beam with respect to the target. In the system shown in FIG. 1B, a 90° bend geometry is illustrated. The 90° bend leads to a resolution R on the order of 1000-1200, which is in excess of that required. Sufficient resolution could probably be obtained by a 45° magnet, for example.

Beam Shaping

The magnet geometry should be such that the magnetic field deflection produces a reasonable shape of the ion beam 50. A suitable shaped beam has an aspect ratio A of the largest lateral dimension 1 and the largest vertical dimension L of the beam spot at the point of emergence ranging between 0.3 and 3, and a current density variation of no more than 75% halfway across these dimensions. This ensures the production of a reasonably broad beam before and after electrostatic scanning unit 37. The dimensions 1 and L of the beam can vary between 0.5 inches up to several inches, but should not be shorter, to avoid space charge effects leading to excessive beam divergence during further ion transport and deceleration in the deposition chamber 300 up to the substrate 461.

An electrostatic scanning unit 37 is connected between analyzer magnet unit 36 through flange 3701 and is connected to chamber 300 through flange 3702. Unit 37 consists of chamber 3703 containing four electrostatic deflection plates (two of which are shown in FIG. 1 3704a and 3704b) arranged perpendicular to each other and located outside the path of the beam 50. Electrical fields are separately applied to each set 3704a and 3704b of plates in order to scan the beam and produce uniform beam density over a spot size of interest. The amount of scanning S can be expressed as the product of X and Y where X and Y are the relative deflections in two horizontal, perpendicular directions.

Deposition Chamber 300

Deposition chamber 300 (FIG. 1B and FIG. 8) comprises, in general, a housing 400, a beam isolation line 410, molecular sources of both Knudsen cell-type 420a,b and electron beam evaporation type 430, an electron suppressor grid 450 and a substrate holder/Faraday cup manipulator 460.

Deposition System

Figure 8:
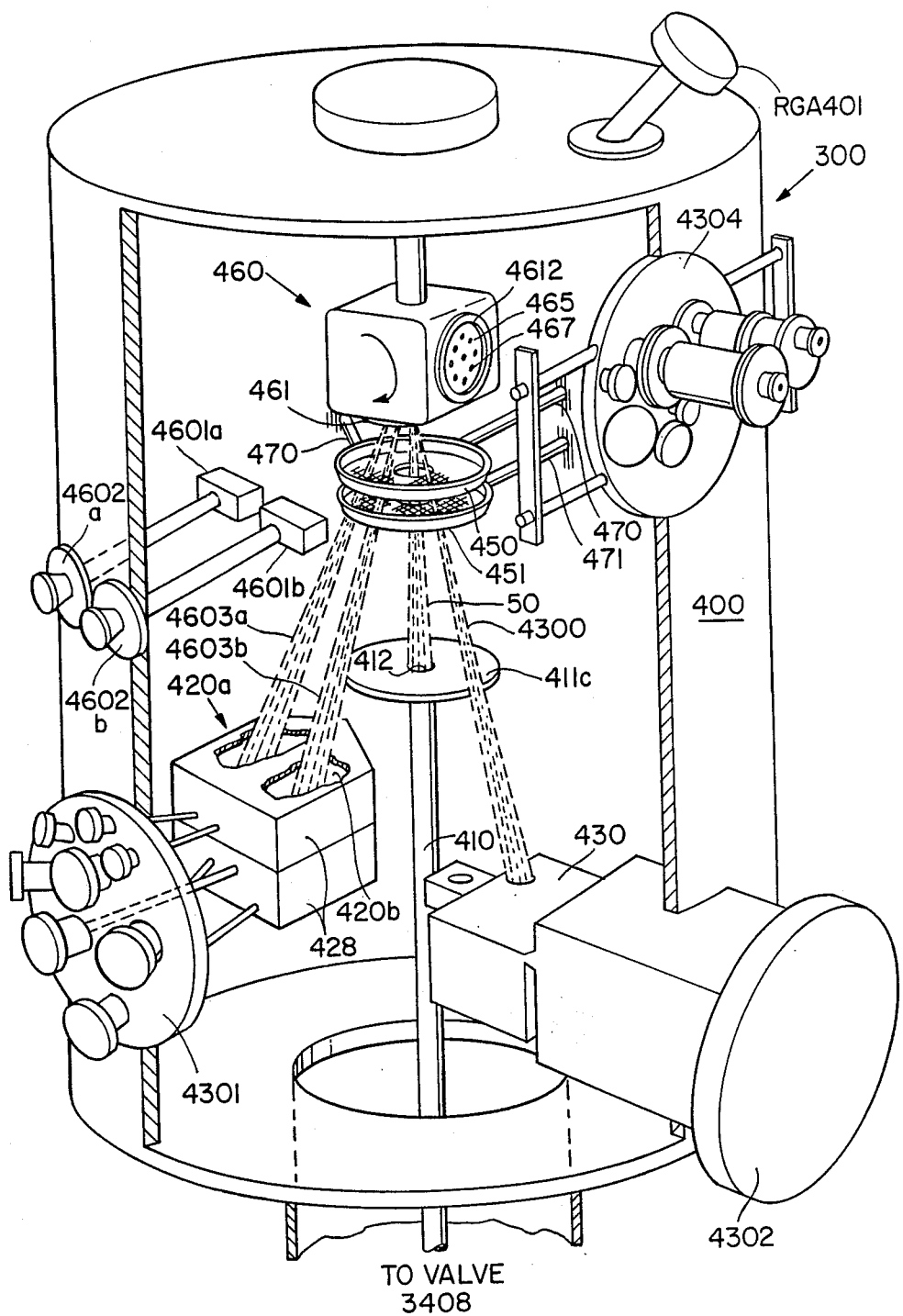
FIG. 8 is a perspective partial cutaway view of a deposition chamber.

The housing 400 of deposition chamber 300, shown in detail in FIG. 8, is made of stainless steel specifically treated for minimal gas adsorption and desorption with the standard accessories of UHV systems, including a Residual Gas Analyzer (RGA) 401, and gauges attached to a flange atop the chamber, and a pumpwell 402. Pumpwell 402 typically includes a large ion pump, a titanium sublimation unit, and a liquid nitrogen cooled cryoshield, of circular shape. The pumpwell 402 is attached to a large flange at the bottom or on the sides of the housing 400. Flanges 4602a and 4602b, which provide access into the chamber for two Inficon Sentinel-type molecular flux monitors 4601a and b (See FIG. 8), which extend into the chamber at a position where adequate sampling of the molecular beams 4603a, 4603b can take place, but where they do not interfere with the CIMD manipulator 460 or electron suppressor grid systems 450 and 411. Other flanges and ports are provided for the following purposes:

(1) flange 4301 for source material insertion to fill the hearth of the Knudsen cells 420a, 420b and flange 4302 for the electron beam unit 430, (2) loadlock and transfer systems for loading and removal of substrates without breaking vacuum (not shown), (3) flange 4304 for optical examination of the mechanical parts of the manipulator, optical spectroscopy to monitor the temperature of the substrate and elements exposed to radiative heating, (4) a RHEED screen and electron gun to monitor epitaxial growth, (5) manipulators of the fork-clamp type to remove or substitute the sample, and electrodes.

All such items are standard elements and will not be described further.

Ion Beam Magnetic Electric Cryoshielding

The ion beam line 410 is attached at the bottom of deposition chamber 400 to beam line positioning unit 340c. The beam line 410 is made of MHU metal for magnetic shielding, thus preventing stray magnetic fields, especially the magnetic fields coming from electron-beam evaporation units 430 or Knudsen cells 420, from deflecting the ion beam 50.

The beam isolation line 410 extends into the chamber 400 up to a distance sufficient to transport the ion beam past the electron-beam evaporation unit 430 and other stray magnetic and electrical fields, but not so far as to shadow the target substrate 461 from molecular beams 4603a and 4603b. Ion beam 50 passes through the length of the beam isolation line 410, exiting at opening 412.

Knudsen Cells (Effusion Cells) 420a,b,c

Effusion cells 420a,b,c are disposed along the interior of the chamber 400. Each cell may comprise a crucible 422 made, for example of pyrolitic boron nitride heated by a heating coil 424. A molecular beam 4603a or b is formed by heating the crucible 422, thus allowing a vapor of the source material to be released from the cell. Each diffusion cell has a shutter 426 associated with it which is mechanically operated by conventional mechanisms (not shown). The function of the shutter is to interrupt the molecular beam from the effusion cells to prevent further growth of the source material on the substrate 461.

Liquid nitrogen-cooled cryopanels 428 (FIG. 8) are provided around each of the cells 420a,b to isolate each cell from its adjacent neighbor. Existing commercial MBE systems also provide a substrate load lock in addition to the growth chamber shown, which is independently pumped and isolated by a gate valve.

Electron Beam Evaporation Sources 430

To produce a molecular beam for some low-vapor pressure materials, effusion sources are inadequate because excessively high temperatures are required to induce appreciable beam currents. Such is the case for silicon. For these materials, an electron beam source 430, shown schematically in FIG. 1b, is used to induce evaporation of materials to produce a molecular beam.

To produce an electron beam, a filament 432 is held at a negative potential while heated by a current passed through it. This filament is placed between two pole pieces of a magnet 433. Electrons are emitted from this filament and accelerated away from the negative potential. A magnetic field created by the pole pieces bends these electrons, causing them to impinge on a crucible 434, containing source material. This beam heats a small volume of source material to very high temperatures, causing a vapor to form a molecular beam 4300 (See FIG. 8). The entire crucible is cooled by running cold water through valves (not shown). A shutter 437 is used to turn the beam "on" or "off".

Both types of molecular sources 420 and 430 are situated around the perimeter of chamber 400, below the opening at the top of beam isolation line 410 or on a side flange close to the bottom of the chamber.

Ion Beam Lens System

Figure 18:
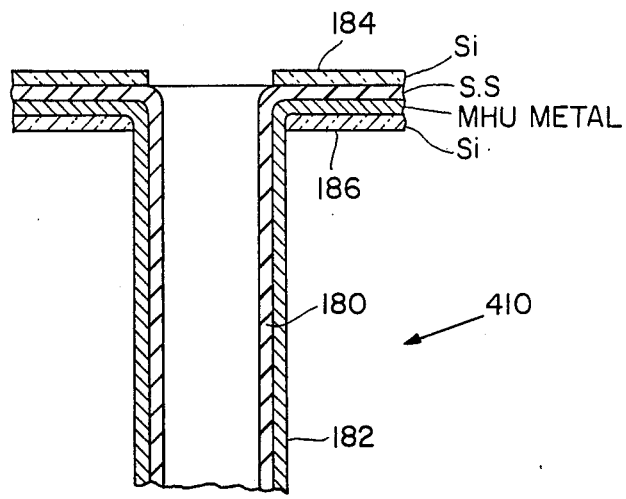
FIG. 18 is a sectional view of a portion of the beam line 410 and electrode 411 illustrating the structural details thereof.

When the ion beam 50 leaves the opening 412 of the isolation line 410, a series of grounded electrodes, two of which are shown at 411 and 451, are employed to maintain constant electric potential along the beam line. As shown in FIG. 18, electrode 411 may comprise a continuation of beam line 410 of laminar construction in which an inner stainless steel core 180 of the beam line is covered by an outer MHU metal cover 182. A circular flange portion of stainless steel and MHU metal forms the conductive element of the grounded electrode 411. The flange portion is sandwiched between removable protective Si discs or wafers 184 and 186, which prevent flashing of metal in system operation. Electrode 411 has a circular aperture of 1.25" internal diameter; slightly larger than the ion beam diameter by 10 to 25%. Electrode 411 is affixed to, or made a part of, the end of the beam line 410.

Figure 15:
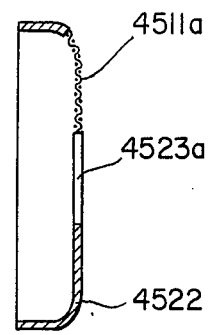
FIG. 15 is a side view along the lines XV—XV of FIG. 13.

Another grounded electrode 451 is supported from rods 471 affixed to the inside wall of chamber 400 and is suspended about one inch below a suppressor electrode 450. Each electrode 451 and 450 is made of two-piece construction comprising a grid or mesh 4511a or b, and a circular curved solid frame 4522a or b (See FIGS. 13-15).

The suppressor electrode 451 is biased at a negative potential of one kilowatt volts to provide a repelling field for electrons emitted from the target (substrate) during deposition. Both electrodes are substantially planar in order to maintain a uniform field over dimensions larger than the beam, so as to prevent de-focusing of the low energy ion beam 50 by small perturbations in the electrostatic field.

The material of the grids 4511a,b and the frames 4522 a,b can be either Si or graphite. The purpose is to have a material that has very low sputtering yield under ion bombardment to avoid destruction of the electrodes during bombardment. It also has to be a fairly rigid material, because the electrodes face the sample when the sample is at temperature. So, the material must resist thermal cycling up to about 800° C. for about 10 minutes, which should be the longest high temperature cycle on the system. The choice of Si, or graphite, allows fair rigidity of the electrodes during thermal stress. Compatibility is also required between the electrodes and the material to be deposited, in order to avoid contamination from sputtering of the electrode material toward the surface of the sample 461 during deposition. From that point of view, Si is an especially good choice. Clogging of the mesh, or grids, by material deposited on it during molecular beam deposition is also a problem. So, dimensionally, the center holes 4522a,b of the electrode is preferably in the order of 1.25 inches (thus, slightly larger than the ion beam). The meshes, or grids, 4603(a–c) should also be removably mounted.

The function of the curved shield or frame 4522a,b is to confine ion bombardment processes, such as sputtering, back scattering, induced desorbtion, and recoil implantation within the ion deposition area. Preferably, this shield should be coated with a compatible material, such as silicon, using the MBE beam. In this way, transport of the suppressor material into the deposited film will be avoided.

A complementary curved surface is provided on the holder 460 for the substrate sample 461 to avoid the possibility of sparking between the substrate holder and the suppressor electrode 450 during deposition (FIG. 1e).

Figure 13:
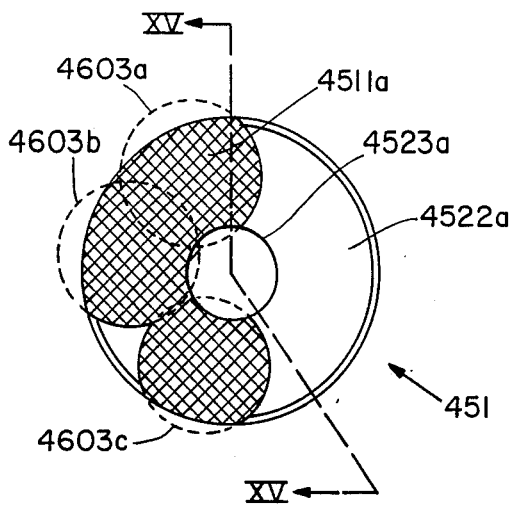
FIG. 13 is a plan view of ground electrode 451.
Figure 14:
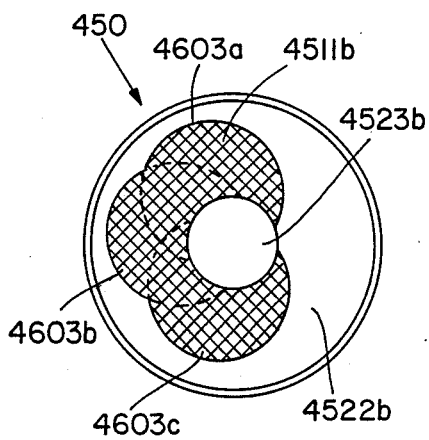

Preferably, as shown in FIGS. 13 and 14, the mesh 4511a and b for the electrodes 451 and 450 is located and sized to permit substantially unimpeded passage of the molecule beams 4603a,b,c.

CIMD Manipulator (460)

Figure 9:
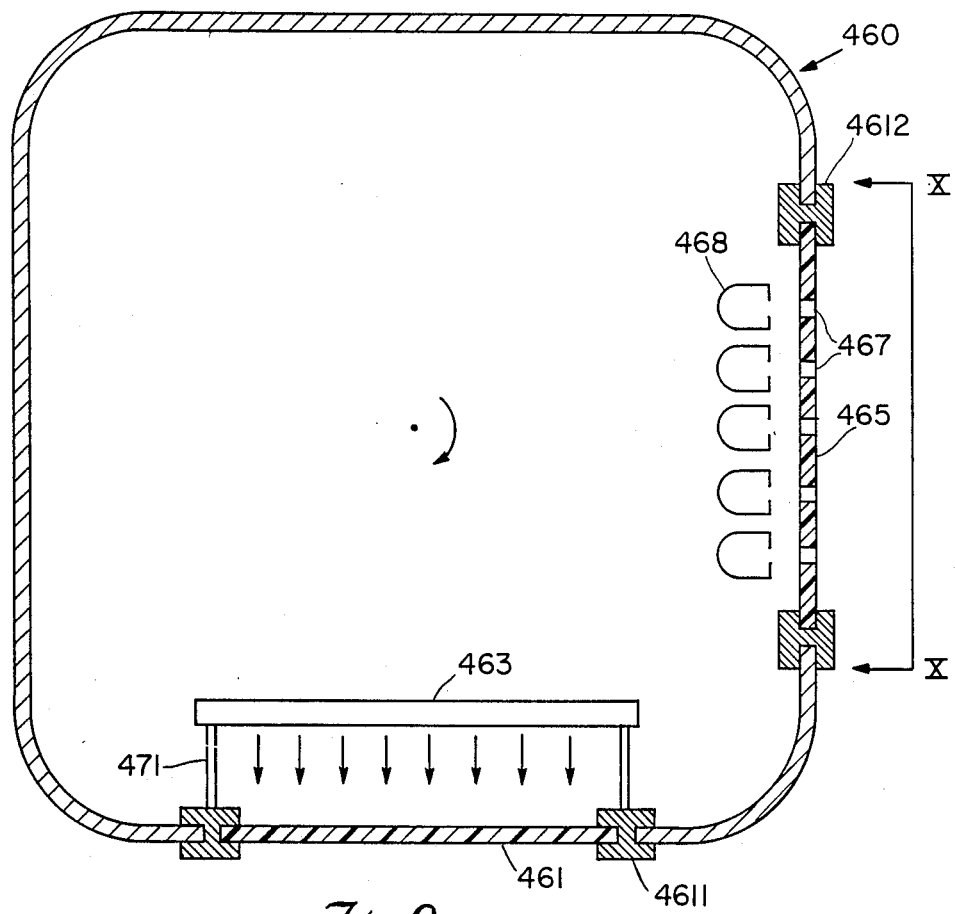
FIG. 9 is a sectional view of a substrate holder and calibration system 460.
Figure 10:
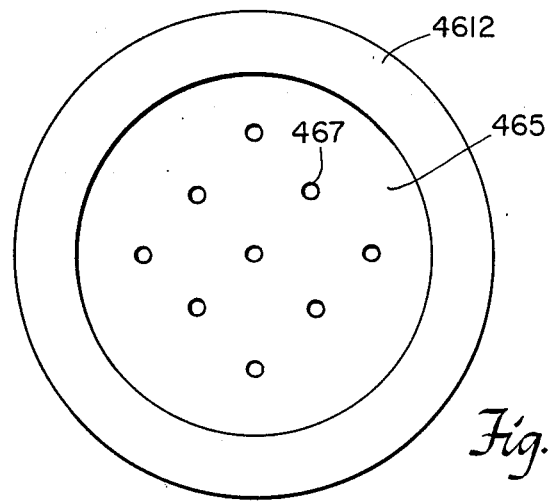
FIG. 10 is a front view along the lines X—X of the calibration unit.

A substrate holder/Faraday cup manipulator 460 is positioned near the top of chamber 300 above the beam isolation line. The manipulator is fashioned with two substrate holders 4611 and 4612 facing 90° apart from each other (See FIG. 9). The manipulator may be rotated so that either holder may be positioned facing ion beam 50, and so that the position of each holder is geometrically identical when facing the beam.

One of these substrate holders 4611 is used to hold the substrate 461 for deposition. Incorporated in the holder is a heating unit 463 for varying the temperature of the substrate during deposition. The heating unit 463 is supported by "stand-off" insulators 471 adjacent substrate 461.

The other substrate holder 4612 holds a dummy substrate 465 in which are drilled an array of holes 467 of uniform and precise dimensions, i.e., 1 mm² area. Behind each hole is a separate Faraday cup 468. These Faraday cups measure current passing through the holes 467 in the dummy substrate 465. Because each Faraday cup measures beam current at a different part of the dummy substrate, a profile of beam current versus position can be made, permitting precise determination of beam characteristics. The holes 467 are of precise dimensions, so an accurate measure of ion flux can be made. An external power supply (not shown) provides the deposition potential $V_{dep}$ to the substrate holder. The heater 463 is placed at the extraction voltage $V_t$ of the ion source.

The electric potential of both sample holders may be varied from the power supply. During ion beam deposition on substrate 461, this potential $V_{dep}$ is used to decelerate incoming ions. During ion flux measurements, using the Faraday cups 468, this potential is varied to simulate conditions during deposition on substrate 461.

The holders all have curved edges, to reduce electric field concentration at the edges and thus reduce the possibility of sparking.

CIMD Processes

Figure 11A:
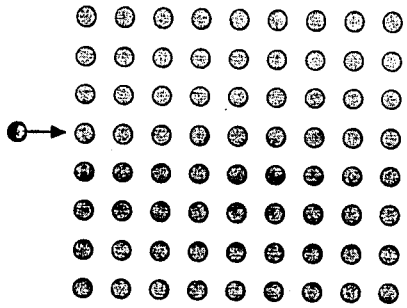
FIG. 11a–11f illustrate various growth reactions obtainable using CIMD.
Figure 11B:
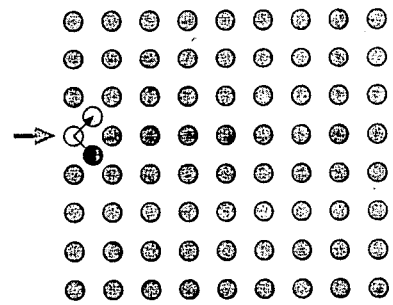
Figure 11C:
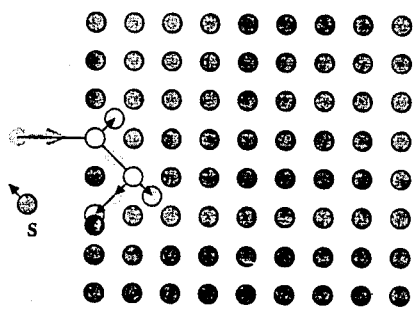
Figure 11D:
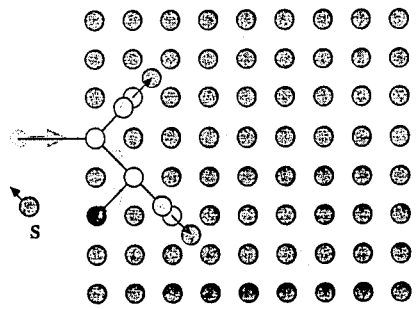
Figure 11F:
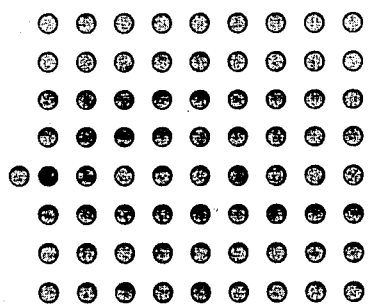
Figure 11E:
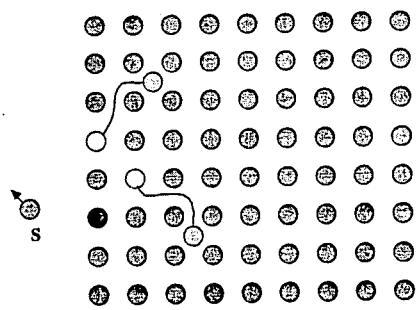

The configuration of the substrate and the beams during deposition is shown in more detail in Figs. 11a–11e, which are schematics of the particle beam processes taking place during combined ion molecular deposition. The ion beam 50 is aimed perpendicular to the sample surface. The incoming ions are represented by filled circles and the substrate, or target, atoms by cross-hatched circles (FIG. 11a). Various processes are represented in the schematic, such as production of a defect pair comprising an interstitial and a vacancy, wherein an incoming ion deflects an atom on the surface of the solid substrate, creating a vacancy where the atom was and an interstitial where the atom moved to (FIG. 11b). In FIG. 11c, two defect pairs are created by a single incoming ion and an atom is sputtered off the substrate. FIG. 11d illustrates collision cascade in which vacancies are created by knocking an atom out of a lattice site and interstitials are caused to relocate. In FIG. 11e, residual interstitials did not find merely a vacancy to athermally recombine with through the elastic strain they introduce in the lattice. They start to thermally diffuse, at temperatures as low as 400 K, because of their unstable position in the lattice. The residual vacancies that were not annihilated are not mobile at this temperature. Eventually, they capture a mobile interstitial and annihilate.

FIG. 11e depicts the final atomic configuration of the first monolayers of the target. There is no residual damage left after both elastic strain and thermal diffusion have acted, and the deposited ion is found on an epitaxial site.

Note that in the illustrations of FIGS. 11a–e, low energy neutral atoms (from the molecular beam, shown as empty circles) are deposited directly at the surface, while the more energetic ions, represented by filled circles, penetrate into the first atomic layers at an average depth controlled by their energy. This characteristic depth can be predicted for low energy ions using specific computational models and is called "the projected range", as in conventional ion implantation terminology. Accurate range prediction for low energy ions has been recently rendered possible by using a formulation of atomic potentials, i.e., the Ziegler-Biersack-Littmark universal potential.

During the CIMD process, the ions interact with the growth front. This region includes not only the outer surface layer of the growing film, but also an important subsurface region, the depth of which is determined by the ion range, and the width of which is determined by the ion range straggling. (The ion range straggling is defined as the statistical deviation of the ions' projected range around the mean projected range.) The ions undergo several types of collisions with the surface and subsurface atoms, thereby modifying the position and increasing the mobility of atoms in the growth zone. These collisions have been calculated in a first approximation by using a Monte-Carlo simulation program, assuming that only binary collisions occur (collisions between two atoms at a time). Such a calculation provides not only accurate values for the ion range and straggling, but also the defect concentration and distribution created by the ion beam.

Figure 12:
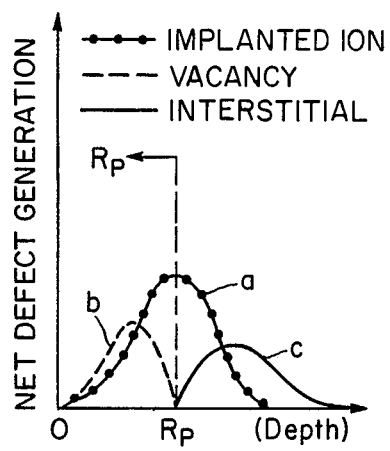
FIG. 12 is a plot of net defect generation in number of defects per ion per atom/cm$^3$, versus depth into the substrate.

The detailed study of these collision cascades shows that the global effect of the ion beam is to locally produce a transitory imbalance of vacancy and interstitial concentrations. This is illustrated in FIG. 12, which is a plot of the depth distribution of intentionally created defects, i.e., implanted species (curve a), vacancy generation (curve b), and interstitial generation (curve c). Specifically, the peak vacancy concentration occurs between the surface and the mean projected range, while the peak interstitial concentration is found beyond that range. To the extent that growth rates are related to vacancy concentrations, this is comparable to the effect of increasing the temperature in the growth zone without significantly affecting the vacancy-interstitial balance. Hence, this process does not disturb the thermal equibilibrium of the substrate held at a subepitaxial temperature in the region directly underneath the growth region. It is postulated that epitaxial growth, resulting from low energy ion bombardment, is similar to a hyperthermal dissipation process in the surface and subsurface region.

The "athermal" generation of defects by ion bombardment can thus lead to epitaxial growth to the extent that a subsequent annihilation of these defects (the hyperthermal dissipation) occurs by a process that favors ordering, rather than amorphization. Ion beam epitaxy can thus be described to a first approximation by a two-step mechanism: athermal generation of a defect imbalance at the growth interface, followed by recombination of these defects into ordered sites. This second stage requires a minimal thermal mobility of the excess self-interstitials, in order for them to reach vacant recombination sites, present in the subsurface region or at the surface, which acts as an important recombination sink. Thus, no mobility of vacancies is required. In this description, epitaxial growth of silicon from an ion beam is not limited by the solid phase epitaxial growth rate between 125° C. and 550° C., because in this range of temperatures, the self-interstitials are still relatively mobile, while the vacancies are not. This is exactly what is observed experimentally: no epitaxial growth of silicon is observed below 550° C. during MBE (exclusively thermal) while epitaxial growth is found in that temperature range over a wide range of deposition rates during IBD.

General Procedure for CIMD Growth

In general, it should be noted that preferably the ion beam is used to provide the high vapor pressure and, hence, more readily vaporized and desolved species, while the molecular beam provides the other material.

Preliminary Steps

First, all the sources are loaded. These include the ion beam source 30 and the molecular beam sources 420 or 430.

Sources

The crucibles 422, also called hearths, of the molecular beam sources 420a–c, are used to contain the materials to be evaporated (See FIG. 1b). They are loaded with changes of approximately the shape of the hearths. The charges should be of at least 99.9995% purity, preferably obtained by zone-refining, with less than 1 part per billion of residual carbon and oxygen specifically.

The ion source material of choice is loaded as a solid charge in source 30 (See FIG. 1a) within a graphite furnace of preferably large dimensions (an inch to several inches) containing a Tungsten filament (not shown) of good purity (99.99%) to avoid contamination of source material, and of fairly large diameter (1.5 mm) and excellent structural homogeneity to ensure its lifetime. The filament is mounted decentered in a rectangular graphite chamber along the longest dimension of the graphite furnace, close to an extraction slit which runs along the longest dimension, as well. The source material is fastened along the filament by additional tungsten wiring.

A reactive gas, such as chlorine, can be used to enhance the ionization and, hence, the source efficiency through a controlled leak valve on the graphite chamber. A different graphite furnace should be used each time a different material has to be deposited to avoid cross-contaminations. Separate furnaces should be used for simultaneous or sequential deposition if the ion source is used in a multi-ion mode, again to avoid cross-contamination. For instance, a separate furnace can be used for the following combination: oxygen/silicon/nitrogen/germanium and should exclusively be used reserved to that specific combination. To increase the efficiency, two separate specially dimensioned graphite furnaces can be mounted in parallel, or one within the other, by putting the furnace of the most refractory materials within the furnace of the least refractory materials. A size adjustment is then necessary. Efficiency can be also enhanced by combining the solid charge with a carrier gas, for instance, silane ($SiH_4$) and solid silicon, but is not recommended because of safety problems associated with the use of explosive (silane) or poisonous gases (Germane for germanium, arsine for arsenic, phosgen for phosphorus, etc.).

Vacuum Conditioning

The deposition chamber 300 should be thoroughly baked at a temperature of no less than 200C after each exposure to atmospheric pressure.

The part of the beamline 410 external to the chamber should be thoroughly baked after each deposition cycle at a temperature of no less than 120° C. and no more than 150° C. to avoid Viton O-ring valve failures and copper evaporation from the cold fingers 19a–c. Cryopumps 27b should be valved off for the first 12 hours of the baking cycle and then brought to room temperature for the next 12 hours for desorption while the beamline walls are kept at 120°–150° C. The turbo pumps 27a will efficiently evacuate the desorbing gases. The total cycle duration can be reduced to no more than a factor of 2 for high speed pumps (1200 liters/sec.).

The manipulator 460 with its electrodes and shields mounted and facing the beamline 410 should be brought to 400° C. for 12 hours, then 600° C. for 12 hours and cycled 10 times to 800° C. for 10 minutes while monitoring the temperature to avoid excursions of temperatures above 800° C. or at 800° C. for more than 10 minutes due to the system's large heating capacitance and simultaneous baking of the chamber.

After the baking, and with the manipulator at 800C, a residual gas analysis is performed with all valves closed, then with beamline valves open to the chamber, then with all valves open (to ion source, beamline and chamber). The analysis should establish a vacuum of at least $2\times 10^{-10}$ Torr to preferably $3\times 10^{-10}$ Torr in the chamber with no oxygen, carbon or water vapor contamination, and minimal amounts of methane (partial pressure of H$_2$O has to be lower than that of methane), and of hydrogen (H) with all valves closed. With all valves open, the partial pressure of residual gases in the chamber cannot raise to more than a factor of two to three for each contaminant and their relative magnitude with respect to each other had to be qualitatively maintained.

Sample Introduction

The substrates 461 have to be introduced through a vacuum-insulated loadlock (not shown) that is also cryopumped to minimize partial pressure rises of water vapor and hydrogen. Each substrate and its holder should be cycled to 1000°-1200° C. for 20 minutes in a separate preparation chamber prior to introduction in the deposition chamber 300.

All the cryoshields, cryopanels and liquid nitrogen-cooled apertures of the beamline have to be cooled by liquid nitrogen 60 minutes before further conditioning. The cryoshields, especially the apertures 25 in the beamline, have to be thermally cycled between each deposition, by heating, baking during the ion beamline bake, and cooling again. This is very important to ensure the cleanliness of the system.

The molecular sources 420 or 430 are heated, either by resistive heating, in the case of Knudsen cells or by electron beam in the case of electron beam sources. The shutters 426 are closed during start-up to desorb spurious gases from the loaded charges and heated elements and to stabilize the fluxes without exposing the substrate to desorbed gases or uneven fluxes during progressive heating.

The ion source 30 should also be heated, the filament biased, the extracting magnetic field optimized for maximum ion current and the analyzing magnetic field selected to obtain the desired Q/M ratio, with the first Faraday cup 3426 (of BLP 340a) inserted. The beam should be maximized and profiled and the next Faraday cup of BLP 340b inserted while the first is removed and the same optimization procedure implemented. The procedure is repeated on each successive Faraday cup of each BLP until the beam hits one of the CIMD manipulator Faraday cups 468. Prior to this last step, a new residual gas analysis is performed to monitor possible partial pressure rises in the chamber. Mass scanning should be performed with the analyzing magnet 36 to detect possible cross-contamination due to different ion specie with similar Q/M ratio. The latter is detected by monitoring isotopic ratios of the materials to be deposited.

Monitoring through residual gas analysis is necessary throughout each step of the energy conditioning to detect contamination from the beam. Each contaminant coming from the ion source 30 should be observed to decrease with time following a radioactive decay law with time. If such a decay is not observed, this means that the ion source graphite furnace is permanently contaminated and should be immediately discarded and replaced. In such case, careful analysis of residual gases in each section of the vacuum system should be conducted to monitor contaminant traces prior to further operation. Additional baking cycles may be required to remove the contaminant. In persistent cases, the contaminated parts should be carefully electropolished in chemicals of electronic purity and rebaked.

The beam should be profiled using the Faraday cups 468 on the CIMD manipulator 460 at the transport energy $eV_t$ and the beam scanning optimized to ensure a uniformity of $+/-5\%$ across the beam area. The transport voltage should then be applied to the substrate holder electrode plus the voltage of the electron suppressor. ($V_{substrate} = V_t - |V_{sup}|$.)

The voltage is then progressively increased on the substrate electrode following a logarithmic progression to smaller increments leading to a progressive decrease of deposition voltage until the desired deposition voltage is reached. At each increment, the beam is automatically scanned for uniformity and the beam scanning adjusted to maximize both current and uniformity.

Deposition

The deposition can then be started. The Faraday cup side of the manipulator is swung out of the way and the substrate 461 put into position. The desired sequence of combined ion beams 50 and molecular beams 4603 or 4300 for deposition is then started. Such a sequence can include thermally enhanced ion beam cleaning or molecular beam cleaning of the substrate, followed by simultaneous deposition from the ion beam and molecular beam, followed by a switch of either or both beams to different species. The last sequence of deposition can be the formation of a protective cap prior to exposure of the substrate to atmospheric pressure upon removal of the substrate for further processing, such as, for instance, photolithography, etc., as in conventional wafer processing.

During each species change of the ion beam, all valves are closed and the new ion beam is established, accordingly, to the automated procedure above described. If intolerable pressure rises occur, the deposition should be interrupted, all valves closed through automatic shut-off, and the system should be pumped down until a tolerable pressure is obtained. Such cycles can be used at regular intervals during deposition to maintain low contamination levels. Cryoshields should be closely monitored as warming-up could cause extensive system failures due to uncontrolled gas desorption. For each beam interruption, shutters are used for the molecular beams while a cooled Faraday cup is used to intercept the ion beam 50.

The deposition rates are monitored through flux sensors, for example, photoluminescence sensitive sensors 4601a,b for the molecular beams and through current integration on the substrate electrode for the ion beam. Currents can also be monitored on the electrodes and suppressors as an additional control in the event of significant beam losses due to defocusing, backscattering, thermally enhanced desorption, chemical and physical sputtering (also thermally enhanced) by ions, neutrals and electrons particles.

The windows of the system should be shielded with lead covers during deposition from a decelerated ion beam because of bremstrahlung leading to gamma rays emission. All sensitive and essential deposition monitors, including ion gauges should be shielded for ionic, electronic or X-ray bombardment. This can be easily achieved through adequate positioning of these instruments with respect to the confinement structures specially designed to shield these from the substrate electrode and electron suppressors.

At the end of the deposition, the substrate is allowed to cool until it has reached a temperature of no more than 50° C. prior to removal from the ultra-high-vacuum system. This may occur in an isolated preparation chamber (not shown). A fresh substrate may then be introduced immediately after one is transported in the preparation chamber and the production can henceforth continue sequentially.

Specific examples of CIMD processed will now be described in detail.

EXAMPLE 1

Oxide/Nitride Formation and Heterodielectrics

Silicon dioxide has been formed at room temperature using low energy oxygen ions (1–500 eV) [See S. S. Todorov, etc., *IEEE Electr. Dev. Lett.*, Vol. EDL-7, 8, 468 (1986); "Low Energy Ion-Solid Interactions for Non-Equilibrium Growth of Semiconductor Based Heterostructures, N. Herbots, S. J. Pennycook, B. R. Appleton, T. S. Noggle and R. A. Zhur, Conference Proceedings of the 12th International Conference on Atomic Collisions in Solids, Okoyama, Japan, October 1987 (ICACS 1987); "Non-Equilibrium Growth of Semiconductor Hetero-structures by Ion Beam Deposition (IBD) and Also Combined Ion-Molecular Deposition (CIMD), 34th Meeting of the American Vacuum Society, Topical Conference, "Deposition of Growth: Frontiers of Microelectronics", Anaheim, CA, Nov. 2–6, 1987, to be published in the *Journal of Vacuum Science and Technology* (1988), N. Herbots, T. S. Noggle, B. R. Appleton, R. A. Zhur, *Journal of Vacuum Science and Technology*, July/August 1987; "Low Temperature Growth of Thin $SiO_2$ Films by Ion Beam Deposition (IBD)", N. Herbots, B. R. Appleton, T. S. Noggle, D. M. Zehner, R. A. Zhur, Materials Research Society, Fall Meeting, 1986, Boston, MA, December 1986, Symposium A, "Beam-Solid Interactions", Edts. T. S. Picraux, M. O. Thompson, et al.)]

The thickness of the oxide growth was limited by a number of factors, including the buildup of excess interstitials, as a barrier to oxygen diffusion at the oxide/silicon interface.

By alternately depositing silicon and oxygen ions using an ion beam process, it is possible to overcome the thickness limitation and to successfully grow thin oxides (7–30 nm) with high density and atomically sharp interfaces.

A much more efficient process is to use CIMD and simultaneously provide the Si species through an effusion source, such as 420a, for the molecular beam 4603a, along with oxygen ions from the ion beam 50. Likewise, difficult germanium based oxides may be grown by simultaneously depositing oxygen ions from the ion beam 50 and germanium from the molecular beam 4603a. Similarly, silicon oxides, nitrides, or oxynitrides, may be formed on germanium or gallium arsenide substrates with atomically sharp interfaces, leading to the formation of a new class of heterostructures that we call heterodielectrics.

Growth of other dielectrics, such as $CaF_2$ or $BaF_2$, may also be achieved by CIMD, using an ion beam of the group VIIA element and a molecular beam of the group IIA element. These materials may also be grown epitaxially, depending on the substrate. Such a material would allow for subsequent growth of another epitaxial material, resulting in a completely epitaxial heterodielectric structure. Such a structure would be ideal for the design of three dimensional integration of monolithic semiconductor devices.

Other compounds may be grown using multiple molecular beams, for example, $SrTiO_3$, $Pb(ZrTi)O_3$, $BaTiO_3$, $Zr(Ca)O_2$, $ZR(Y)O_2$, $LiNbO_3$. Some of these materials ($LiNbO_3$, $SrTiO_3$) are used as optical materials for integration of optoelectronic devices. Some ($Ze(Ca)O_2$, $Zr(Y)O_2$) are insulators and can be used in heterodielectric structures. All are useful as substrate materials for epitaxial growth of other materials. In the growth of these materials by CIMD, the oxygen species are provided by the ion beam and the other species by molecular beams.

A typical heterodielectric process may proceed as follows:

(a) GaAs is supplied from a Ga molecular beam 4603a and As from molecular beam 4603b to form a GaAs film on a substrate.

(b) The molecular beams are switched "off" while, simultaneously, an oxygen or nitrogen ion beam is switched "on" and an Si molecular beam, i.e., 4300, also switched "on". A low temperature Si oxide or nitride is thereby deposited on the GaAs substrate, forming a heterodielectric structure. Other examples comprise Si oxides or nitrides on Ge, InP, AlGaAs, CdTe, etc.

EXAMPLE II

Inhibition of Phase Separation

Phase separation poses an obstacle to the production of homogenous thin films of metastable or unstable compositions in conventional growth techniques, such as MBE, CVD, thermal oxidation or nitridation. In CIMD, the kinetic energy of ions is used to provide energy for mixing which prevents segregation from occurring at the substrate surface. This is a non-equilibrium process, which is more completely described by irreversible thermodynamics. In addition, kinetic enhancement of growth rate is used in CIMD to lower processing temperature, thus lowering the available energy for thermal activation of phase separation. For example, in growing oxides of GaAs, undesirable decomposition of GaAs oxides into two separate oxide phases, $Ga_2O_3$ and $As_2O_5$ usually occurs when the GaAs oxide phases are grown by a thermal method, such as annealing in oxygen.

The separate phases result in non-uniform and uncontrollable properties of the oxides. During CIMD growth, an oxygen ion beam is used to grow the oxide, without having to use thermal annealing to diffuse oxygen into the film. Normally, in the prior art, "thermal" oxides are grown on semiconductors by annealing in an oxygen atmosphere, to diffuse oxygen radicals across the interface between the oxygen gas phase and the substrate solid phase and to make them migrate through the top oxide layer. For most semiconductor processing, annealing is undesirable for the preservation of sharp interfaces, as is required in modulation-doped superlattices. The annealing temperature makes adjacent layers interdiffuse. Thermal annealing is specifically undesirable for GaAs because the temperature activates separation of Ga and As oxides. Unwanted segregation is thus avoided using an "athermal" CIMD process, as above described.

The growth of oxides on GaAs, or any other semiconductor, is technically extremely difficult by MBE, alone, because oxygen cannot be introduced in an MBE system without extreme contamination. IBD growth of such an oxide on GaAs is thickness limited.

For high quality epitaxial film, the MBE is preferred for growing the film, the IBD for growing the oxide or nitride. In CIMD, this can be accomplished without breaking vacuum. A typical process for CIMD GaAs oxide or nitride growth is as follows:

(a) Ga and As are evaporated, simultaneously, by effusion cells 420a and 420b as neutral molecules and deposited by beams 4603a and 4603b, respectively, on substrate 461 as GaAs films;

(b) after a suitable thickness of GaAs film is formed, oxygen ions or nitrogen ions are extracted from the ion source 30 and deposited via beam 50 on the GaAs film while continuing to deposit the Ga and As neutral molecules from the effusion cells.

This results in a simultaneous deposition of GaAs from the molecular beam and oxygen from the ion beam forming a GaAs oxide layer on the GaAs filter over the substrate.

Note that the temperature need not be increased at all during the oxidation step. Thus, the temperature may be kept low enough so that the critical temperature for occurrence of oxide segregation is not reached during CIMD. In this manner, an oxide of any thickness can be grown on GaAs without the occurrence of phase separation.

Another phase decomposition problem which can be avoided by CIMD is the formation of Ga microdroplets during GaAs MBE, due to the high vapor pressure of As, which evaporates easily from the substrate. In the CIMD process, gallium is provided from the molecular beam and arsenic from the ion beam. The growth temperature is lowered, such that the arsenic does not evaporate and leave Ga microdroplets behind.

Another problem solved by CIMD is the reduction and segregation of copper during MBE of the high-critical temperature superconductors Yttrium Barium Copper Oxide (Y-Ba-Cu)O, Lanthanum Strontium Copper Oxide (La-Sr-Cu)O, or Barium Europium Copper Oxide (Ba-Eu-Cu)O, and similar compounds. In CIMD, the oxygen is provided by the ion beam and the metals (Y, Ba, Le, Eu, Cu, etc.) by the molecular beams. Therefore, the incorporation of oxygen can occur at low temperature and the copper does not segregate. Control of the amount of copper is also more precisely controlled by the process, as well as the oxyreduction of the copper.

In both of these examples, segregation is avoided by introducing ions uniformly into the entirety of a surface. This uniformity ensures a constant concentration of ions (and molecules) across the film. Thus, any inhomogeneity caused by a phase separation is mitigated as growth proceeds. Once an homogenous region is buried by subsequently grown material, phase separation can only take place by bulk diffusivity. Hence, the temperature of the substrate can be selected to be low enough so that bulk diffusivity becomes negligible, without affecting the deposition rate, since this rate can be controlled by the ion kinetic energy when CIMD is used, rather than by temperature alone, as in conventional MBE process.

EXAMPLE III

Modification of Strain in Superlattice for Increased Layer Thickness

In this example, the lattice mismatch of elements, such as of Si and Ge which prohibits thick-layer superlattice formation, is compensated by the strain induced by intentionally created point defects. By introducing an excess of vacancies in the Ge lattice the Ge lattice will shrink slightly to match the spacing of the Si lattice.

In this example, both silicon and germanium are made available from both molecular and ion sources. As noted earlier, the number of interstitial defects depends on the ratio between ion beam flux and neutral (molecular beam) flux. The number of vacancy defects depends on a convolution of the number of ions used and the ion energy. The ion to neutral ratio and the ion energy are important parameters in controlling defect population in thin films.

Specifically, to form a IVA/IVA lattice, such as a Si/Ge lattice, silicon is grown concurrently using a molecular beam of Si from an electron source and an ion beam of Si. A high ion to Si molecular beam neutral ratio ($\sim 1$) and a low energy Si ions ($\sim 13$ eV) is employed in the Si growth to minimize the ratio of vacancies created to interstitials created, because vacancies need much higher temperature to anneal than interstitials. Hence, increasing atomic mobility of interstitial creation, rather than by temperature. Next, germanium from two sources is grown on the Si substrate. A low Ge ion/neutral ratio ($\sim 0.05$) and higher energy ions ($\sim 50$ eV) is employed in the Ge growth to minimize interstitial creation. The result is that the silicon has a lower vacancy/interstitial ratio than the germanium. This effectively increases the lattice parameter of silicon with respect to the Ge by means of lattice strain.

Thus, by controlling the parameters of ion energy and ion/neutral ratio, the lattice parameter between heteromaterials may be matched or adjusted enough as to favor the layer-by-layer (Frank-Van der Merve) epitaxial growth mode over the Vollmer-Weber (pure islanding without formation of a continuous mode) epitaxial growth mode and over the Stranski-Krastanov's epitaxial growth mode (islanding and continuous film), thereby solving the problem of growth of Si/Ge superlattices. Similar strain modulation may be used to eliminate lattice mismatch in III-V layered compounds, i.e., InP or GaAs or III-VI layered compounds, such as ZnSe or ZnS.

EXAMPLE IV

Control of the Point Defect Concentration in the Deposited Film and in the Substrate As previously stated, a transient, temperature-dependent imbalance in the local defect concentration at the growth interface is responsible for both expitaxial and thin film growth. Experimental evidence of anomalous defect distributions has indeed been found in previous IBD studies. Residual interstitial loops were found in irradiated substrates at distances up to three orders of magnitude larger than the range of the ions used in the processing and were called, therefore, "buried damage". This effect has been demonstrated to originate only under irradiation of a silicon substrate at temperatures between 125° and 600° C. Although dopant diffusion is virtually nonexistent at these temperatures, the self-interstitials, once created, are much more mobile and may ultimately coalesce in a buried damage layer. Additional evidence of the role of temperature in defect transport is the fact that the depth at which the buried damage is found decreases with temperatures, for a fixed deposition time. In addition, no buried damage is found in films deposited at room temperature. This evidence shows the clear role of thermal transport of the excess defects during direct defect generation from an ion beam.

This concept can be applied in the creation of lattice-matched substrates for heteroepitaxy. For example, high quality epitaxial gallium arsenide can be grown on silicon substrates using a buffer layer of ion beam deposited silicon growth by CIMD prior to GaAs deposition from molecular beams. This "buffer layer" may contain numerous interstitial loops and be of generally poor electronic quality. The sole purpose for growing this layer is to meet heteroepitaxial growth criteria, rather than playing a role in the electrical behavior of the structure. This buffer layer provides a silicon substrate for GaAs heteroepitaxy that favors homogenous nucleation of a dislocation free GaAs phase by presenting an enlarged lattice spacing, without preferential sites for disclocation nucleation.

SUMMARY

In summary, CIMD provides a process and apparatus for growing thin films by using simultaneously, concurrently, or sequentially, a molecular beam and an ion beam. It combines the attractive properties of two existing technologies for materials growth, i.e., MBE and IBD. It also allows the formation of novel semiconductor-based heterostructures that until now could not be formed by MBE or IBD alone. CIMD can also be used to create noval, desirable properties, in more conventional heterostructures, than can be formed by existing processes, because this novel method allows athermal control of the microstructure and the formation of chemical bonds, using atomic dynamic processes.

More specifically, the use of directional, monoenergetic and mass-analyzed ion beams to directly grow thin films, significantly lowers the activation energy of solid phase epitaxial growth, allowing the formation of homoepitaxial silicon films, and germanium heteroepitaxial films on silicon at temperatures as low as 400 K. However, these results could not heretofore find a direct application, because of the slow growth rate and the large density of residual defects present in IBD grown epitaxial films formed at low temperatures. The combination of a molecular beam with an ion beam during the growth process solves these two limitations in an efficient, economical and scientifically attractive way.

CIMD enables the synthesis of dense, high-quality silicon oxides with atomically sharp interfaces on silicon and germanium at room temperature. The thickness and rate limitations inherent to IBD alone can be resolved by simultaneously using a molecular beam. The formation of these oxides is more efficient if an oxygen ion beam is used to induce room temperature oxidation with a molecular beam to provide the species to be oxidized. Such a combination allows the formation of a novel class of heterostructures, i.e., heterodielectrics, such as silicon oxide, nitride, and oxynitride on germanium, and on gallium arsenide, for example. Forming a high quality passivating/insulating film and an atomically sharp interface on materials, such as germanium and gallium arsenide, represents a very significant advance in semiconductor technology, since the formation of stable, high quality passivation layers on these materials is presently an unresolved issue for quantum well-based devices and optoelectronic integration.

Along the same line, the growth at low temperature of gallium arsenide epitaxial films on silicon and germanium is rendered possible by CIMD, using an arsenic ion beam and a gallium molecular beam. This method is applicable to all compound semiconductors, including III-V and II-VI type semiconductors (i.e., InP, ZnSe, HgCdTe, GaSb and InSb, etc.)

In addition, the use of an ion beam allows the introduction of high vapor pressure materials into the processing environment. Because of contamination problems associated with such materials, the use of MBE is traditionally limited or dedicated to processing of one type semiconductor material only. Elimination of this restriction represents a major advance in processing superlattices and artifically structured materials.

Equivalents

Figures 16, 17:
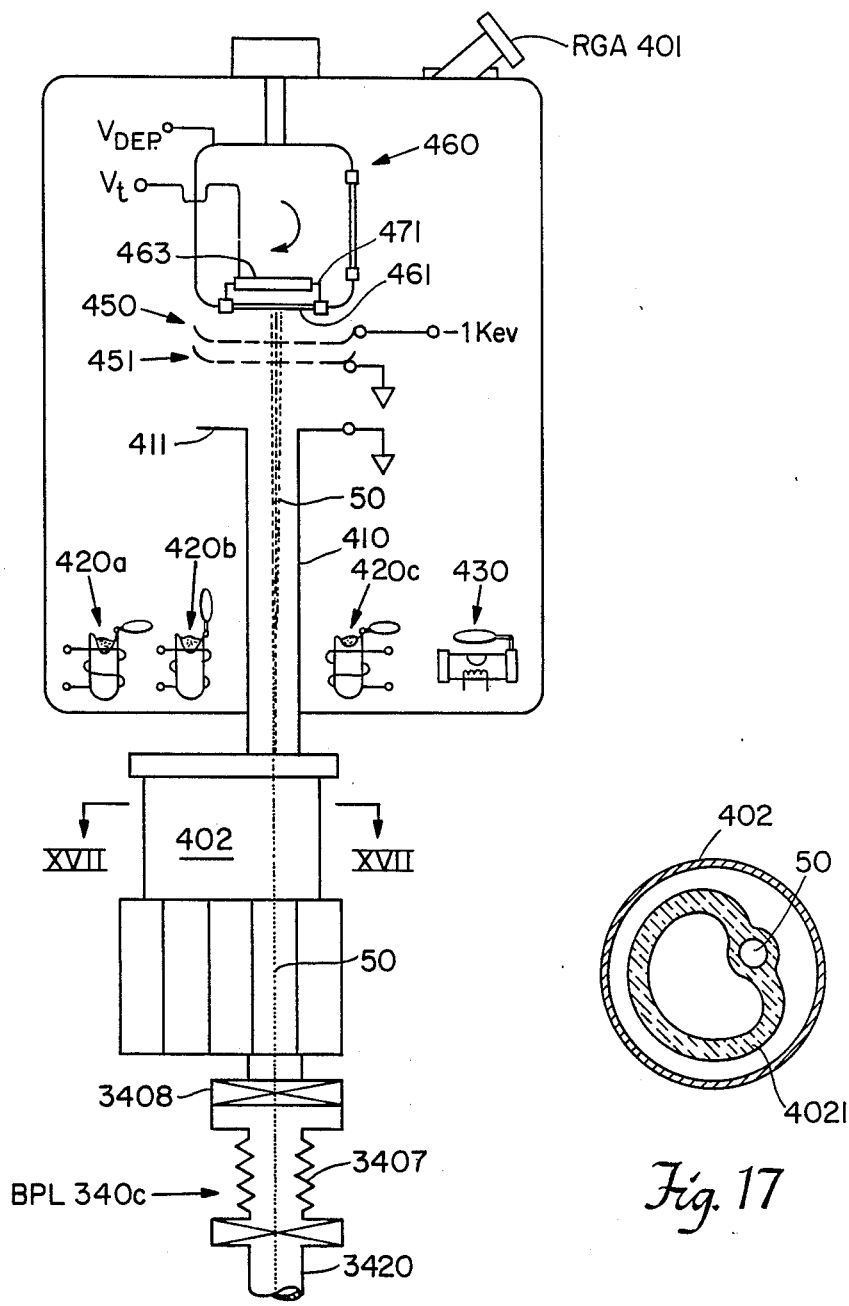
FIG. 16 is a schematic of an alternate embodiment.
FIG. 17 is a schematic view along the lines XVII—XVII of FIG. 16.

This completes the description of the preferred embodiments of the invention. Those skilled in the art may recognize other equivalents, which equivalents are intended to be encompassed by the claims attached hereto. For example, in some applications, it may be desirable to simplify the system by locating pump well 402 between the BPL 340c and encircling the beam line 410 as it enters the chamber 400. In this modification, the pump well opening would be off-center and the pump well $LN_2$ filled cryoshield 4021 would become a part of the beam cryoshield, as shown schematically in FIGS. 16 and 17. Furthermore, the invention is not intended to be limited to any particular number or type of molecular beam sources. Any combination of such sources can be used to achieve a desired result.

Heater means are provided adjacent the substrate to control the substrate temperature during deposition. Temperature selected for deposition will vary with the application. For example, epitaxial growth of Si, Ge or GaAs on Si substrates may be achieved at substrate temperatures ranging from 150°–400° C. In general, as stated earlier, CIMD allows satisfactory growth at substrate temperatures much lower than MBE and alone, and allows much higher growth rate, especially for compound films, than IBD would allow for.

We claim:

1. Apparatus for the deposition of materials on a substrate in a chamber comprising:
   (a) a high vacuum reaction chamber;
   (b) beam forming means coupled to said chamber for introducing a relatively high energy beam of ions of a first species into an area adjacent said substrate;
   (c) a deceleration electrode within said chamber adjacent said beam forming means for decelerating said beam of ions;
   (d) a suppressor electrode within said chamber and located adjacent said substrate and having an opening therein to permit said beam of ions to impinge on said substrate;
   (e) a molecular beam source within said chamber for supplying a beam of a second species for deposition on said substrate.

2. The apparatus of claim 1 further including shutter means for abruptly interrupting said molecular beam.

3. The apparatus of claim 1 wherein a substrate heater is provided adjacent said substrate for substrate temperature control.

4. The apparatus of claim 1 wherein the suppressor electrode is provided with two openings, one for the ion beam and one for the molecular beam.

5. The apparatus of claim 4 wherein the molecular beam opening comprises a mesh coated with material compatible with the deposited materials.

6. The apparatus of claim 1 wherein an array of Faraday cups disposed behind openings in a simulated substrate is adapted to be interchangeable with said substrate.

7. The apparatus of claim 1 wherein the first species is more readily vaporized than the second species.

8. The apparatus of claim 1 wherein the first species is more contaminating specie than the second speices.

9. The apparatus of claim 1 wherein the first species is taken from the class comprising As, O, N, Ge, In, Cd; and the second species is taken from the class comprising Ga, Si, Ge, P, Te, Sb.

10. The apparatus of claim 1 wherein multiple molecular beam sources are present in the chamber, providing molecular beams of one or more species.

11. The apparatus of claim 10 wherein the species of said ion beam is also provided by a molecular source.

12. The method of forming oxides or nitrides of materials at low temperatures comprising the steps of:
   (a) forming a molecular beam of the material to be oxidized or nitrized in a high vacuum chamber in which a substrate is placed;
   (b) simultaneously, directing a low energy ion beam of oxygen or nitrogen ions at said substrate to concurrently form oxides or nitrides of said materials on said substrate.

13. The method of claim 12 wherein the substrate is formed of germanium, silicon, III-V, or II-VI compounds.

14. The method of forming III-V or II-VI compounds on substrates in a high vacuum environment comprising the steps of:
   (a) forming an ion beam of the more readily vaporizable element of said compound and directing said beam at said substrate;
   (b) simultaneously forming molecular beam(s) of the other element(s) of said compound and permitting said beam(s) to impinge on said substrate.

15. The method of claim 14 wherein the compound is GaAs, the element of step (a) is As, the element of step (b) is Ga, and the substrate is Si or Ge.

16. A method of forming compound films of two materials on a heated substrate in a common high vacuum deposition chamber comprising:
   (a) generating an ion beam of one material and directing said ion beam at a surface of said substrate;
   (b) simultaneously generating a molecular beam of another material and directing said molecular beam at said surface to form a low defect density compound film of said two materials on said surface.

17. The method of claim 16 wherein one material is an element taken from the group of elements in column III of the periodic table and the other is an element taken from the group of elements in column V or wherein one material is taken from column VI and the other from column II or where both materials are taken from column IV.

18. The method of claim 17 wherein the material of the molecular beam is a group III element and the material of the ion beam is a group V element.

19. The method of claim 18 wherein the group III element is Ga and the group V element is arsenic.

20. A method of forming compound oxides, nitrides, or oxynitrides on the surface of a substrate in a high vacuum deposition chamber comprising:
   (a) generating an ion beam of one material taken from the group of oxygen or nitrogen, or both, and directing said ion beam at said substrate surface;
   (b) simultaneously generating one or more molecular beams of one or more different materials and directing said one or more molecular beams at said substrate surface to form an oxide, nitride or oxynitride of said one or more materials.

21. The method of claim 20 wherein the molecular beam materials are taken from the group III or IV elements of the periodic table.

22. The method of claim 20 wherein the substrate is composed of the same material as the one or more molecular beam materials.

23. The method of claim 20 wherein the ion beam material comprises oxygen ions and the molecular beam material is Ge, Si, Ga, or GaAs.

24. A method of controlling the flux of defects $\Phi_d$ in the formation of films of materials on a substrate surface in a high vacuum ion beam and molecular beam deposition chamber comprising the steps of:
   (a) generating an ion beam of one material and directing said ion beam, at a predetermined energy level $E_i$ and ion flux $\Phi_i$, at said surface;
   (b) generating a molecular beam of another material and directing said molecular beam at a predetermined energy level $E_o$ and flux $\Phi_o$ at said surface;
   (c) varying the ratio of $\Phi_i$ to $\Phi_o$ to control the flux of defects.

25. The method of claim 24 wherein the ion beam is generated by a current powered ion source and the ratio of $\Phi_i$ to $\Phi_o$ is varied by changing the current.

26. The method of claim 24 wherein the molecular beam is provided by a heated effusion cell and the ratio of $\Phi_i$ to $\Phi_o$ is varied by varying the heat supplied to the cells.

27. The method of modifying strain in superlattice semiconductor structures formed of successively deposited layers of material comprising the steps of:
   (a) forming a first layer of one species of material supplied from an ion beam and a molecular beam, wherein a high ion to molecular beam ratio of material is employed along with a relatively low ion energy to minimize the ratio of vacancies created to interstitials in the first layer;
   (b) forming a second layer over the first layer with a low ion to molecular beam ratio of a second material and a higher ion energy to minimize interstitial creation in the second layer.

28. The method of claim 27 wherein the first layer is formed of one IVA material and the second layer of a different IVA material.

29. The method of claim 28 wherein the first layer material is Si and the second layer material is Ge.

30. The method of claim 27 wherein the first layer is formed of a III-V compound and the second layer of a different III-V compound.

31. The method of claim 27 wherein the first layer is formed of a III-VI compound and the second layer of a different III-VI compound.

32. The method of claim 27 wherein the first layer is GaAs and the second layer is InP.

33. The method of claim 27 wherein the first layer is ZnS and the second layer is ZnSe.

34. The method of forming metal-copper oxide superconductor materials on a substrate comprising the steps of:
   (a) forming an ion beam of oxygen in a high vacuum chamber in which said substrate is contained and directing said beam at said substrate;
   (b) simultaneously directing molecular beams of said copper and other metals at said substrate to form on said substrate an oxide of said metals and copper.

35. The method of claim 34 wherein the other metals are selected from the group of La, Sr, Y, Eu and Ba.

36. The method of claim 12 wherein the ion beam comprises ions of an element from the class of halides, and the molecular beam comprises an element from class IIA of the periodic table.

37. The method of claim 12 wherein the material in the ion beam is oxygen, and the materials in the molecular beams are a combination of elements from columns IIA and IVB, 1A and VG (e.g. Li and Nb), IVA and IVB or IIIB and IVB.

38. In combination:
   (a) an ion beam forming means for generating an accelerated beam of ions, said ion beam forming means comprising:
      (i) an ion source for generating a beam of ions, and
      (ii) an accelerator for accelerating said beam of ions;
   (b) first beam positioning means adjacent said ion beam forming means for positioning said beam along an axis;
   (c) collimating means adjacent said first beam positioning means for collimating said beam;
   (d) second beam positioning means adjacent said collimating means for further positioning said beam along said axis;
   (e) magnetic means for bending said beam along a path determined by the charge to mass ratio of the ions in the beam;
   (f) scanning means in the path of said beam after it is bent for deflecting said beam;
   (g) a third beam positioning means for further positioning said beam about an axis after it has been bent;
   (h) a deposition chamber capable of being evacuated;
   (i) beam isolation means for coupling the ion beam from said third beam positioning means into said chamber while shielding the ion beam from magnetic fields within the housing;
   (j) molecular beam means within said chamber for generating a molecular beam of vaporized particles for depositing said particles on said substrate;
   (k) a holder adapted to hold a substrate for deposition of ions from said ion beam and particles from said molecular beam on said substrate; and
   (l) an ion beam lens means for directing the beam from said beam isolation means toward said substrate to deposit said ions on said substrate.

39. The combination of claim 28 wherein the ion beam lens means comprises a series of electrodes for mounting constant electric potential along the path of the ion beam.

40. The combination of claim 39 wherein one of said electrodes comprises a continuation of said beam isolation means and consists of an inner conductive core and an outer magnetic shielding means material.

41. The combination of claim 39 wherein one of the electrodes comprises a suppressor electrode for decelerating the ion beam and is biased negatively.

42. The combination of claim 41 wherein the suppressor electrode is a flat disc formed of a central wire mesh portion and an outer circular solid portion.

43. The combination of claim 38 wherein the ions from said ion beam and particles from said molecular beam deposit simultaneously.

44. Apparatus for the deposition of materials on a substrate mounted on a holder in a chamber comprising:
   (a) a high vacuum reaction chamber;
   (b) beam forming means coupled to said chamber for introducing a relatively high energy beam of ions of a first species into an area adjacent said substrate;
   (c) a deceleration electrode within said chamber adjacent said beam forming means for decelerating said beam of ions;
   (d) a suppressor electrode within said chamber and located adjacent said substrate and having an opening therein to permit said beam of ions to impinge on said substrate;
   (e) a molecular beam source within said chamber for supplying a beam of a second species for deposition on said substrate simultaneously with impingement of said ion beam on said substrate.

45. The apparatus of claim 44 further including shutter means for abruptly interrupting said molecular beam.

46. The apparatus of claim 44 wherein a substrate heater is provided adjacent said substrate for substrate temperature control.

47. The apparatus of claim 44 wherein the suppressor electrode is provided with two openings, one for the ion beam and one for the molecular beam.

48. The apparatus of claim 1 wherein additional molecular beam sources are provided within the chamber for supplying additional species.

49. The apparatus of claim 1 wherein the first and second species are the same material.

* * * * *

UNITED STATES PATENT AND TRADEMARK OFFICE
CERTIFICATE OF CORRECTION

PATENT NO. : 4,800,100
DATED : Jan. 24, 1989
INVENTOR(S) : Nicole Herbots and Olof C. Hellman It is certified that error appears in the above-identified patent and that said Letters Patent is hereby corrected as shown below:

Column 24, Claim 18, line 67, after "is" insert ---a---.
Column 27, Claim 37, line 6, delete "VG" and insert ---VB---.

Signed and Sealed this

First Day of August, 1989

Attest:

DONALD J. QUIGG

Attesting Officer

Commissioner of Patents and Trademarks